(12) United States Patent
Uoshima

(10) Patent No.: US 12,099,094 B2
(45) Date of Patent: *Sep. 24, 2024

(54) LEARNING METHOD, STATE ESTIMATION METHOD, AND STATE ESTIMATION DEVICE FOR STATE ESTIMATION MODEL OF SECONDARY BATTERY

(71) Applicant: HONDA MOTOR CO., LTD., Tokyo (JP)

(72) Inventor: Minoru Uoshima, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 237 days.

This patent is subject to a terminal disclaimer.

(21) Appl. No.: 17/671,845

(22) Filed: Feb. 15, 2022

(65) Prior Publication Data

US 2022/0283229 A1 Sep. 8, 2022

(30) Foreign Application Priority Data

Mar. 8, 2021 (JP) ................................ 2021-036377

(51) Int. Cl.
| | | |
|---|---|---|
| *G01R 31/36* | (2020.01) | |
| *G01R 31/367* | (2019.01) | |
| *G01R 31/392* | (2019.01) | |
| *H01M 10/48* | (2006.01) | |

(52) U.S. Cl.
CPC ......... *G01R 31/367* (2019.01); *G01R 31/392* (2019.01); *H01M 10/48* (2013.01)

(58) Field of Classification Search
CPC .. G01R 31/367; G01R 31/392; G01R 31/385; G01R 31/396; G01R 31/388; G01R 31/389; H01M 10/48; G06N 3/08; G06N 20/00

See application file for complete search history.

(56) References Cited

U.S. PATENT DOCUMENTS

| | | | | |
|---|---|---|---|---|
| 2004/0207367 | A1* | 10/2004 | Taniguchi | ............... G11C 11/34 320/149 |
| 2021/0091583 | A1* | 3/2021 | Kamijima | ............. H01M 10/48 |
| 2022/0179007 | A1* | 6/2022 | Chida | .................. G01R 31/367 |

FOREIGN PATENT DOCUMENTS

| | | | | |
|---|---|---|---|---|
| JP | 2003-249271 | | 9/2003 | |
| JP | 2003249271 | A * | 9/2003 | ........... G01R 31/392 |
| JP | 2005019337 | A * | 1/2005 | ......... H05B 41/2882 |

* cited by examiner

*Primary Examiner* — Catherine T. Rastovski
*Assistant Examiner* — Lal C Mang
(74) *Attorney, Agent, or Firm* — Rankin, Hill & Clark LLP

(57) ABSTRACT

A learning method of a state estimation model includes training the state estimation model to learn a relationship of state estimation input data obtained by preprocessing terminal currents and terminal voltages of a secondary battery with a charge rate or a deterioration degree of the secondary battery. The state estimation input data includes time-series data of: difference gradients of terminal voltage differences with respect to terminal current differences; open circuit voltages; open circuit voltage change amounts; and integrated current values of the terminal currents.

11 Claims, 13 Drawing Sheets

LEARNING METHOD, STATE ESTIMATION METHOD, AND STATE ESTIMATION DEVICE FOR STATE ESTIMATION MODEL OF SECONDARY BATTERY

INCORPORATION BY REFERENCE

The present application claims priority under 35 U.S.C. § 119 to Japanese Patent Application No. 2021-036377 filed on Mar. 8, 2021. The content of the application is incorporated herein by reference in its entirety.

BACKGROUND OF THE INVENTION

Field of the Invention

The present invention relates to a learning method, a state estimation method, and a state estimation device, of a state estimation model for estimating the state of an operating secondary battery.

Description of the Related Art

Secondary batteries, which are storage batteries that can be used repeatedly by charging, are widely used in moving objects such as electric vehicles and electric bicycles, and buildings. When these secondary batteries are used, it is important to appropriately know the state of the secondary batteries for the purpose of knowing appropriate charging timing and replacement timing. Here, the state of the secondary battery means SOC (charge rate, remaining capacity, State Of Charge) and/or SOH (deterioration degree, State Of Health).

Conventionally, it is known to use two neural networks for the purpose of appropriately automatically determining the deterioration state and SOC of an operating secondary battery in real time (Japanese Patent Laid-Open No. 2003-249271). This technique uses: a first neural network trained to estimate the deterioration state D (distinction of "normal", "caution" and "deterioration") of the secondary battery, from the time-series combination of the measured values of the operating parameters (voltage V, current I, internal impedance Z, temperature T) of the secondary battery; and a second neural network trained to estimate the SOC of the secondary battery from the measured values of the operating parameters and the estimated deterioration state D.

On the other hand, electrical characteristics of secondary batteries including, for example, SOC-OCV (open circuit voltage) characteristics, internal impedance characteristics, and/or dependence of these characteristics on SOH, may vary depending on the manufacturers and/or models of the secondary batteries. Therefore, the relationship of the voltage V, current I, and internal impedance Z with the SOC and/or SOH (hereinafter, SOC and the like), of the secondary battery, often greatly varies depending on the manufacturer and models of the secondary battery.

Therefore, the above-mentioned conventional technique, which directly input the measured values of the voltage V, the current I, the internal impedance Z, and the temperature of the secondary battery to the neural network in training the neural network, determines one manufacturer and model of the secondary battery (target secondary battery) to be estimated, and uses a secondary battery of the same manufacturer and model to collect the training data of the neural network.

The conventional neural network trained in this way can accurately estimate the SOC and the like for a secondary battery of the same manufacturer and model as the secondary battery to be estimated. However, when secondary batteries with different electrical characteristics of various manufacturers and/or models are to be estimated, the conventional neural network has difficulty in accurately estimating those SOCs and the like.

However, in estimating the state of an operating secondary battery in a vehicle, for example, if one or a set of estimation models (for example, a neural network) can commonly be used to accurately estimate the SOCs and the like of secondary batteries of various manufacturers and models, the estimation models would conveniently expand the range of choices for the secondary battery to be used.

The present invention has been made in view of the above-mentioned circumstances, and an object of the present invention is to accurately estimate charge rates (SOC) and/or deterioration degrees (SOH) of operating secondary batteries with various electrical characteristics of different manufacturers and models of these secondary batteries.

SUMMARY OF THE INVENTION

An aspect of the present invention is
a learning method of a state estimation model of a secondary battery, the learning method using machine learning, the state estimation model estimating a charge rate and/or a deterioration degree of the operating secondary battery, the secondary battery being connected to a load or a charger, the learning method including:
a step of measuring state variables at predetermined time intervals, the state variables including terminal currents and terminal voltages of the operating secondary battery;
a step of calculating state estimation input data by pre-processing the state variables; and
a step of training the state estimation model to learn a relationship of the state estimation input data with the charge rate and/or the deterioration degree of the operating secondary battery, by machine learning,
wherein the step of calculating:
uses time-series data of the terminal currents and time-series data of the terminal voltages to calculate current differences and voltage differences, each current difference being a difference in the terminal currents, each voltage difference being a difference in the terminal voltages;
uses time-series data of the current differences and time-series data of the voltage differences to calculate difference gradients, each difference gradient being a change rate of the voltage differences with respect to the current differences in a period to a present from a past that goes back a first predetermined time from the present; and
generates the state estimation input data including:
time-series data of the difference gradients;
time-series data of open circuit voltages of the operating secondary battery;
time-series data of open circuit voltage change amounts, each open circuit voltage change amount being obtained by subtracting the open circuit voltage in a past that goes back a second predetermined time from a present, from the present open circuit voltage;
time-series data of difference gradient change amounts, each difference gradient change amount being obtained by subtracting the difference gradient in the past that goes back the second predetermined time from the present, from the present difference gradient; and time-series data of integrated current values, each integrated current values being a sum of the terminal current values continuously acquired in a period to the present from the past that goes back the second predetermined time from the present.

According to another aspect of the present invention, the state estimation input data further includes time-series data of the terminal currents.

According to yet another aspect of the present invention, the step of calculating:

uses time-series data of the terminal currents and time-series data of the terminal voltages, and time-series data of the difference gradients, as voltage estimation input data, to estimate an open circuit voltage of the operating secondary battery; and uses the estimated open circuit voltage to calculate the state estimation input data.

According to yet another aspect of the present invention, each difference gradient is calculated using the least squares method.

According to yet another aspect of the present invention, each current difference and each voltage difference are respectively a fourth-order difference of time-series data of the terminal currents and a fourth-order difference of time-series data of the terminal voltages.

According to yet another aspect of the present invention, the state estimation model is configured of an RNN (Recurrent Neural Network).

According to yet another aspect of the present invention, an intermediate layer of the RNN configuring the state estimation model is configured of an LSTM (Long Short Term Memory) or a GRU (Gated Recurrent Unit).

According to yet another aspect of the present invention, the state estimation model is configured of a one-dimensional CNN (Convolutional Neural Network).

According to yet another aspect of the present invention, the state estimation model is generated by learning using time-series data of state variables including terminal currents and terminal voltages for each of a plurality of secondary batteries with different electrical characteristics, the secondary batteries each being connected to a load or a charger.

Yet another aspect of the present invention is a state estimation method of a secondary battery, including:

a step of measuring state variables including terminal currents and terminal voltages of an operating secondary battery to which a load or a charger is connected, at predetermined time intervals;

a step of calculating state estimation input data by preprocessing the state variables; and a step of estimating a present charge rate and/or a deterioration degree of the operating secondary battery, from the state estimation input data, using a state estimation model trained by a learning method of the secondary battery state estimation model according to any one of the above, wherein the step of calculating:

uses time-series data of the terminal currents and time-series data of the terminal voltages to calculate current differences and voltage differences, each current difference being a difference in the terminal currents, each voltage difference being a difference in the terminal voltages;

uses time-series data of the current differences and time-series data of the voltage differences to calculate difference gradients, each difference gradient being a change rate of the voltage differences with respect to the current differences in a period to a present from a past that goes back a first predetermined time from the present; and generates the state estimation input data including:

time-series data of the difference gradients;

time-series data of open circuit voltages of the operating secondary battery;

time-series data of open circuit voltage change amounts, each open circuit voltage change amount being obtained by subtracting the open circuit voltage in a past that goes back a second predetermined time from the present, from the present open circuit voltage;

time-series data of difference gradient change amounts, each difference gradient change amount being obtained by subtracting the difference gradient in the past that goes back the second predetermined time from the present, from the present difference gradient; and time-series data of integrated current values, each integrated current values being a sum of the terminal current values continuously acquired in a period to the present from the past that goes back the second predetermined time from the present.

Yet another aspect of the present invention is a state estimation device of a secondary battery, the device including a processor, wherein the processor is configured to:

measure state variables at predetermined time intervals, the state variables including terminal currents and terminal voltages of the operating secondary battery;

perform preprocessing of the state variables, measured by the state observation unit, to calculate state estimation input data; and estimate a present charge rate and/or a deterioration degree of the operating secondary battery, from the state estimation input data, using a state estimation model trained by a learning method of the state estimation model of the secondary battery according to any one of the above, wherein in the preprocessing, the processor:

uses time-series data of the terminal currents and time-series data of the terminal voltages, each acquired by the state observation unit, to calculate current differences and voltage differences, each current difference being a difference in the terminal currents, each voltage difference being a difference in the terminal voltages;

uses time-series data of the current differences and time-series data of the voltage differences to calculate difference gradients, each difference gradient being a change rate of the voltage differences with respect to the current differences in a period to a present from a past that goes back a first predetermined time from the present; and generates the state estimation input data including:

time-series data of the difference gradients;

time-series data of open circuit voltages of the operating secondary battery;

time-series data of open circuit voltage change amounts, each open circuit voltage change amount being obtained by subtracting the open circuit voltage in a past that goes back a second predetermined time from a present, from the present open circuit voltage;

time-series data of difference gradient change amounts, each difference gradient change amount being obtained by subtracting the difference gradient in the past that goes back the second predetermined time from the present, from the present difference gradient; and time-series data of integrated current values, each integrated current values being a sum of the terminal current values continuously acquired in a period to the present from the past that goes back the second predetermined time from the present.

According to an aspect of the present invention, the charge rates (SOC) and/or deterioration degrees (SOH) of secondary batteries with various electrical characteristics of different manufacturers and models can be accurately estimated in operation of these secondary batteries.

DETAILED DESCRIPTION OF THE PREFERRED EMBODIMENTS

The inventor of the invention of the present application has found that there is a correlation between: a change mode of terminal current and terminal voltage changes of secondary batteries, that is, a high-order change mode; and an internal state (OCV, SOC and or SOH) of the secondary batteries, at least among the secondary batteries in the same type (for example, the secondary batteries in "lithium ion batteries" that are identical as the type). Then, the inventor has obtained knowledge such that: a parameter expressing a high-order change mode of terminal current and terminal voltage of the secondary battery to be used is determined to be a change rate (difference gradient to be described below) of the differences in time-series data of the terminal voltages (voltage differences) with respect to the differences in time-series data of the terminal currents (current differences); this parameter is determined to be an input for a model (for example, a neural network); and thereby there can be generated a model that can accurately estimate a state of secondary batteries with various electrical characteristics of different manufacturers and models. The invention of the present application is based on such outstanding knowledge.

The following describes embodiments of the present invention with reference to the drawings.

First Embodiment

Figure 1:
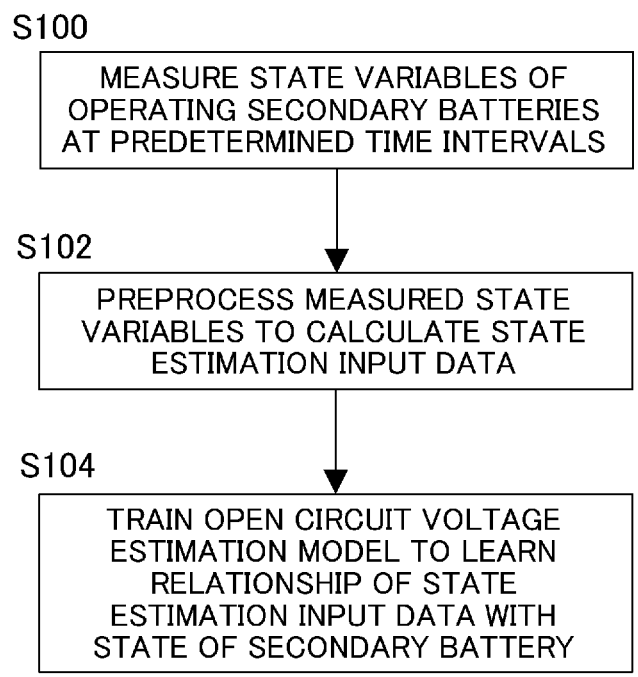
FIG. 1 is a flow chart showing a procedure of a learning method of a state estimation model according to a first embodiment of the present invention.

FIG. 1 is a diagram showing a procedure of a learning method of a state estimation model of a secondary battery according to a first embodiment of the present invention. The learning method of this state estimation model includes: a step (S100) of measuring a state variable including a terminal current and a terminal voltage of an operating secondary battery to which a load or a charger is connected, at predetermined time intervals; and a step (S102) of pre-processing the measured state variable to calculate the state estimation input data. In addition, this learning method of an open circuit voltage estimation model includes: a step (S104) of training the state estimation model by machine learning to learn a relationship of the state estimation input data with the charge rate and/or deterioration degree as a state of the operating secondary battery.

Figure 2:
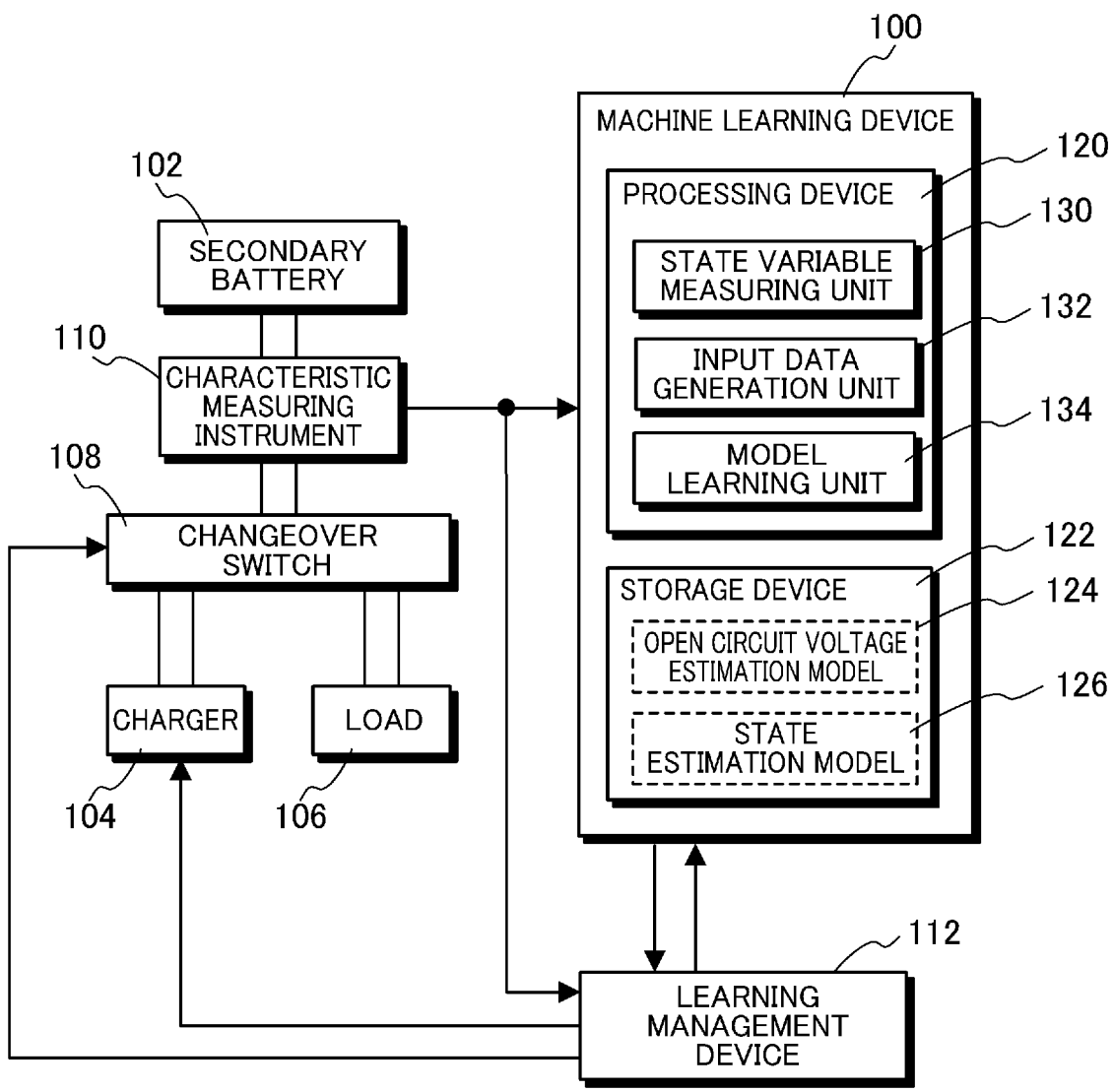
FIG. 2 is a diagram showing a configuration of a machine learning device that executes the learning method of the state estimation model shown in FIG. 1.

FIG. 2 is a diagram showing an example of the configuration of a learning management device and a machine learning device that execute the learning method of the state estimation model shown in FIG. 1. The learning management device and the machine learning device also perform machine learning of the open circuit voltage estimation model for estimating the open circuit voltage of the secondary battery. The state estimation model and the open circuit voltage estimation model are configured of, for example, a neural network. A learning management device 112 controls the operation of a secondary battery 102 during the machine learning, calculates the measured values of the open circuit voltage, SOC (state of charge), and SOH (state of health) as teacher data, and provides the machine learning device 100 with the measured values.

The secondary battery 102 is charged by the charger 104 and discharged by energizing the load 106. The charger 104 is, for example, a DC power source, and the load 106 is, for example, a motor. Whether to charge the secondary battery 102 from the charger 104 or discharge it to the load 106 is chosen by the changeover switch 108. The changeover switch 108 and the secondary battery 102 have a characteristic measuring instrument 110 inserted therebetween.

The characteristic measuring instrument 110 measures the present values of predetermined state variables of the secondary battery 102. The predetermined state variables may include a terminal voltage Vte, a terminal current Ite, an internal impedance Z of the secondary battery 102, and a temperature T (° C.) of the housing surface of the secondary battery 102. Here, the internal impedance Z can be measured according to the prior art, for example, by inputting an alternating current, which is a measurement signal, to the secondary battery 102.

The terminal current Ite of the secondary battery 102 takes a positive value when the secondary battery 102 discharges and takes a negative value when it charges.

[1. Learning Management Device]

The learning management device 112 controls charge-discharge of the secondary battery 102, generates teacher data for training the open circuit voltage estimation model and the state estimation model, and outputs the teacher data to the machine learning device 100. The learning management device 112 is, for example, a computer, which starts an operation according to an instruction from an operator, and gives an instruction to start and stop the power output to the charger 104 and an instruction to change the operation to the changeover switch 108.

The learning management device 112 acquires a terminal current Ite, a terminal voltage Vte, and an internal impedance Z of the secondary battery 102 during charging and discharging from the characteristic measuring instrument 110 at predetermined time intervals.

The learning management device 112 calculates the open circuit voltage Voc of the secondary battery 102 from the acquired terminal current Ite, terminal voltage Vte, and internal impedance Z, and generates time-series data of the open circuit voltages Voc. The time-series data of the open circuit voltages Voc is used as teacher data at the time of training the open circuit voltage estimation model executed by the machine learning device 100 to be described below.

In addition, the learning management device 112 uses the time-series data of the terminal voltages Vte and terminal currents Ite acquired above to calculate the charge amount (full charge amount) when the secondary battery 102 charges to the limit and the present charge amount. In this embodiment, SOH is the full charge amount (unit: Ah), and SOC is the ratio (%) of the present charge amount to the full charge amount.

[2. Machine Learning Device]

The machine learning device 100 includes a processing device 120 and a storage device 122. The storage device 122 is composed of, for example, a volatile and/or non-volatile semiconductor memory, a hard disk device, or the like. The storage device 122 stores an open circuit voltage estimation model 124 and the state estimation model 126 generated by a model learning unit 134 to be described below.

The processing device 120 is, for example, a computer including a processor such as a CPU (Central Processing Unit). The processing device 120 may have a configuration including a ROM (Read Only Memory) in which a program is written, a RAM (Random Access Memory) for temporarily storing data. The processing device 120 includes a state variable measuring unit 130, an input data generation unit 132, and a model learning unit 134, which serve as functional elements or functional units.

These functional elements included in the processing device 120 are embodied, for example, by the processing device 120, which is a computer, executing a program. Note that the computer program can be stored in any computer-readable storage medium. Alternatively, all or part of the functional elements included in the processing device 120 may be configured by hardware including one or more electronic circuit components.

[2.1. Function of State Variable Measuring Unit]

The state variable measuring unit 130 executes the step S100 shown in FIG. 1. Specifically, the state variable measuring unit 130 acquires a state variable including the terminal current Ite and the terminal voltage Vte of the secondary battery 102 to which the load 106 or the charger 104 is connected, from the characteristic measuring instrument 110 at predetermined time intervals. Thus, the state variable measuring unit 130 measures the state variables at predetermined time intervals. The state variable measuring unit 130 may further measure the temperature T of the secondary battery 102, which is a state variable, at the predetermined time intervals.

[2.2. Functions of Input Data Generation Unit]

The input data generation unit 132 uses the terminal currents Ite and terminal voltages Vte acquired by the state variable measuring unit 130, to generate voltage estimation input data for training the open circuit voltage estimation model 124. Furthermore, for example, after the input data generation unit 132 finishes training the open circuit voltage estimation model 124, the input data generation unit 132 executes the step S102 shown in FIG. 1 and also uses the trained open circuit voltage estimation model 124, to generate state estimation input data for training the state estimation model 126.

[2.2.1. Generation of Voltage Estimation Input Data]

The voltage estimation input data is input data to the open circuit voltage estimation model 124 generated by the input data generation unit 132 for training the open circuit voltage estimation model 124.

Specifically, the input data generation unit 132 first calculates a current difference $\delta$Ite, which is the difference of the terminal current Ite, and a voltage difference $\delta$Vte, which is the difference of the terminal voltage Vte from the time-series data of the terminal currents Ite and the time-series data of the terminal voltages Vte. In this embodiment, the current difference $\delta$Ite and the voltage difference $\delta$Vte are respectively the fourth-order differences $\Delta^4$Ite of the time-series data of the terminal currents Ite and the fourth-order differences $\Delta^4$Vte of the time-series data of the terminal voltages Vte.

The input data generation unit 132 uses the time-series data of the current differences $\delta$Ite and the time-series data of the voltage differences $\delta$Vte calculated above, to calculate the difference gradient Sdiff, which is the change rate of the voltage difference $\delta$Vte with respect to the current difference $\delta$Ite, in a period to the present from a past that goes back a predetermined time T1 from the present.

The calculation of the current difference $\delta$Ite, the voltage difference $\delta$Vte, and the difference gradient Sdiff is to be described in detail in the description of the state estimation input data to be described below.

Then, the input data generation unit 132, for example, generates voltage estimation input data including the following three time-series data, which are input data for training the open circuit voltage estimation model 124, in a period to the present from a past that goes back a predetermined time T2 from the present:

time-series data of terminal currents Ite,
time-series data of terminal voltages Vte, and
time-series data of the difference gradients Sdiff.

[2.2.2. Generation of State Estimation Input Data]

The state estimation input data is input data to the state estimation model 126 generated by the input data generation unit 132 in the step S102 of the learning method shown in FIG. 1. Note that the state estimation input data in the step S102 is generated after the open circuit voltage estimation model finishes learning.

Figure 3:
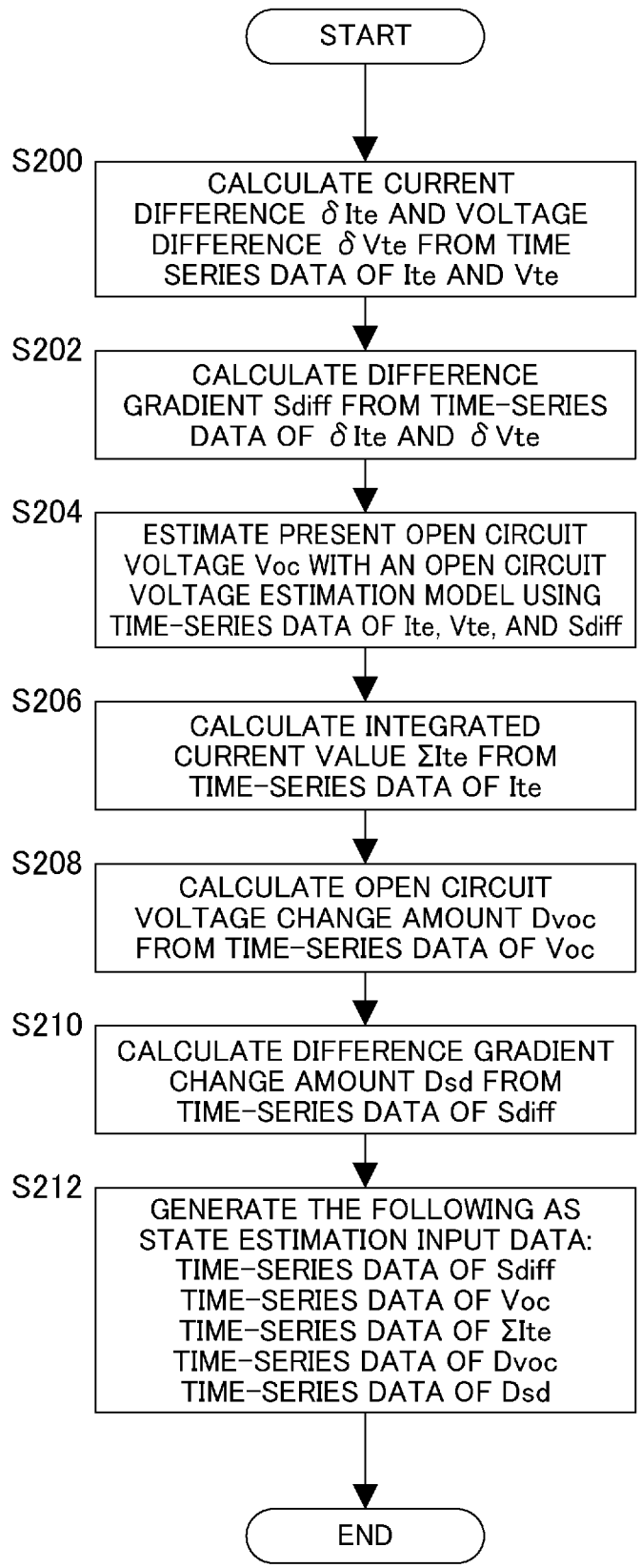
FIG. 3 is a flow chart showing details of processing in a step of calculating state estimation input data in the learning method of the state estimation model shown in FIG. 1.

FIG. 3 is a flow chart showing details of the processing in the step S102 of calculating the state estimation input data in FIG. 1. In the step S102 of calculating the state estimation input data, the input data generation unit 132 first calculates the current differences δIte and the voltage differences δVte, from the time-series data of the terminal currents Ite and the time-series data of the terminal voltages Vte. Each current difference δIte is the difference in the terminal currents Ite, and each voltage difference δVte is the difference in the terminal voltages Vte (S200). Then, the input data generation unit 132 calculates the difference gradient Sdiff (S202) in the period to the present from the past that goes back the predetermined time T1 from the present. The difference gradient Sdiff is the change rate of the voltage difference δVte with respect to the current difference δIte.

The input data generation unit 132 inputs the time-series data of the terminal currents Ite, terminal voltages Vte, and the difference gradients Sdiff in the period to the present from the past that goes back a predetermined time T2 from the present, into the open circuit voltage estimation model 430, and thereby estimates the present open circuit voltage Voc (S204). Subsequently, the input data generation unit 132 calculates an integrated current value ΣIte, which is a sum of the terminal currents Ite measured in a period to a present from a past that goes back a predetermined time T3 from the present (S206). Next, the input data generation unit 132 subtracts the open circuit voltage Voc in the past that goes back the predetermined time T3 from the present, from the present open circuit voltage Voc, and thereby calculates an open circuit voltage change amount Dvoc (S208).

Next, the input data generation unit 132 calculates a difference gradient change amount Dsd by subtracting the difference gradient Sdiff in the past that goes back the predetermined time T3 from the present, from the present difference gradient Sdiff (S210).

Then, the input data generation unit 132 generates the state estimation input data including, for example, the following five time-series data (S212) in a period to the present from the past that goes back a predetermined time T4 from the present, and ends the processing:
time-series data of the difference gradients Sdiff,
the time-series data of open circuit voltages Voc,
time-series data of the integrated current values ΣIte,
time-series data of the open circuit voltage change amount Dvoc, and
time-series data of the difference gradient change amount Dsd.

The following describes: a specific method of calculating the current difference δIte, the voltage difference δVte, the difference gradient Sdiff, the integrated current value ΣIte, the open circuit voltage change amount Dvoc, and the difference gradient change amount Dsd; and the voltage estimation input data and the state estimation input data.

[2.2.2.1. Calculation of Current Difference δIte]

Figure 4:
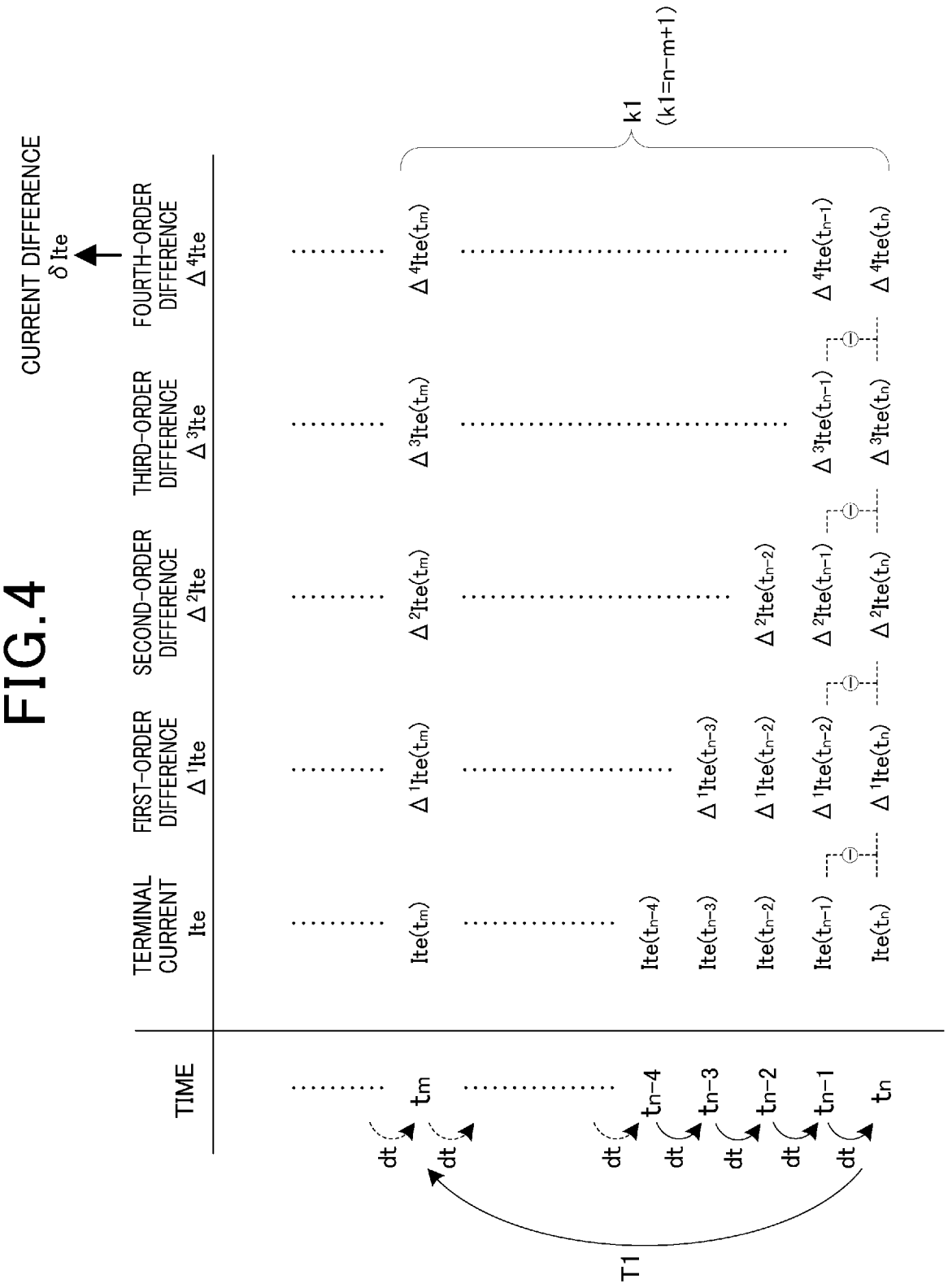
FIG. 4 is a diagram for describing a calculation of a current difference in the processes shown in FIG. 3.

FIG. 4 is a diagram for explaining the calculation of the current difference δIte. In the table shown in FIG. 4, the leftmost column is the first column, and toward the right, there are the second column, the third column, and finally the sixth column. The first column of the table of FIG. 4 indicates the time when the state variable measuring unit 130 repeatedly acquires the terminal current Ite at the time interval dt or the index (number) of the time. The second column is the time-series data of the terminal currents Ite, and indicates the terminal current Ite acquired at each time.

The third, fourth, fifth, and sixth columns respectively indicate the first-order difference $\Delta^1$Ite, the second-order difference $\Delta^2$Ite, the third-order difference $\Delta^3$Ite, and the fourth-order difference $\Delta^4$Ite of the terminal current Ite, which are calculated from the terminal current Ite in the second row.

The hth-order difference $\Delta^h$Ite($t_n$) (h=1, 2, . . . 4) at the present time $t_n$ is calculated by the following expression.

$$\Delta^h Ite(t_n) = \Delta^{h-1} Ite(t_n) - \Delta^{h-1} Ite(t_{n-1})$$

where h=1, 2, 3, 4. In addition, it is assumed that $\Delta^0$Ite($t_n$)=Ite($t_n$).

In other words, the first-order difference $\Delta^1$Ite($t_n$) at the time $t_n$ is calculated by subtracting the terminal current Ite($t_{n-1}$) at time $t_{n-1}$ from the terminal current Ite($t_n$) at the time $t_n$. Furthermore, the second-order difference $\Delta^2$Ite($t_n$) at the time $t_n$ is calculated by subtracting the first-order difference $\Delta^1$Ite($t_{n-1}$) at the time $t_{n-1}$ from the first-order difference $\Delta^1$Ite($t_n$) at the time $t_n$.

Similarly, the third-order difference $\Delta^3$Ite($t_n$) at the time $t_n$ is calculated by subtracting the second-order difference $\Delta^2$Ite($t_{n-1}$) at the time $t_{n-1}$ from the second-order difference $\Delta^2$Ite($t_n$) at the time $t_n$. Similarly, the fourth-order difference $\Delta^4$Ite($t_n$) at the time $t_n$ is calculated by subtracting the third-order difference $\Delta^3$Ite($t_{n-1}$) at the time $t_{n-1}$ from the third-order difference $\Delta^3$Ite($t_n$) at the time $t_n$.

In this embodiment, the input data generation unit 132 determines the fourth-order difference $\Delta^4$Ite of the terminal current Ite at each time to be the current difference δIte. In other words, $$\delta Ite(t) = \Delta^4 Ite(t), \text{ where } t=t_n, t_{n-1}, \ldots$$

[2.2.2.2. Calculation of Voltage Difference δVte]

Figure 5:
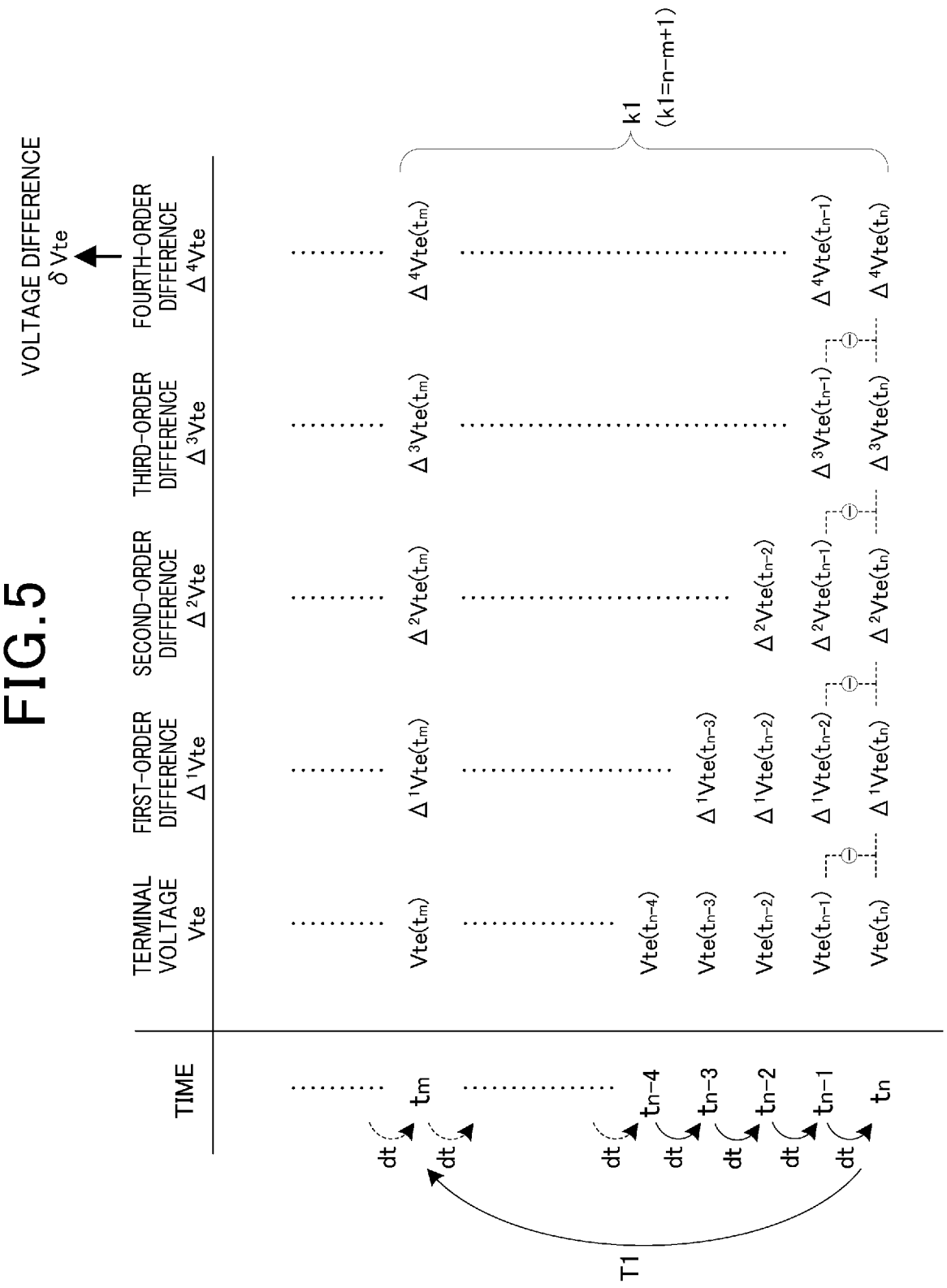
FIG. 5 is a diagram for describing a calculation of a voltage difference in the processes shown in FIG. 3.

The input data generation unit 132 calculates the voltage difference δVte of the terminal voltage Vte in the same manner as the current difference described above. FIG. 5 is a diagram showing a procedure for calculating the voltage difference δVte. In the table shown in FIG. 5, the leftmost column is the first column, and toward the right, there are the second column, the third column, and finally the sixth column. The first column of the table of FIG. 5 indicates the time when the state variable measuring unit 130 repeatedly acquires the terminal voltage Vte at the time interval dt or the index (number) of the time. The second column is the time-series data of the terminal voltages Vte, and indicates the terminal voltage Vte acquired at each time.

The third, fourth, fifth, and sixth columns respectively indicate the first-order difference $\Delta^1$Vte, the second-order difference $\Delta^2$Vte, the third-order difference $\Delta^3$Vte, and the fourth-order difference $\Delta^4$Vte of the terminal voltage Vte, which are calculated from the terminal voltage Vte in the second column.

The hth-order difference $\Delta^h$Vte($t_n$) (h=1, 2, . . . 4) at the present time $t_n$ is calculated by the following expression.

$$\Delta^h Vte(t_n) = \Delta^{h-1} Vte(t_n) - \Delta^{h-1} Vte(t_{n-1})$$

where h=1, 2, 3, 4.

In addition, it is assumed that $\Delta^0$Vte($t_n$)=Vte($t_n$).

In other words, the first-order difference $\Delta^1$Vte($t_n$) at the time $t_n$ is calculated by subtracting the terminal voltage Vte($t_{n-1}$) at the time $t_{n-1}$ from the terminal voltage Vte($t_n$) at the time $t_n$. In addition, the second-order difference $\Delta^2$Vte($t_n$) at the time $t_n$ is calculated by subtracting the first-order difference $\Delta^1$Vte($t_{n-1}$) at the time $t_{n-1}$ from the first-order difference $\Delta^1$Vte($t_n$) at the time $t_n$.

Similarly, the third-order difference $\Delta^3 Vte(t_n)$ at the time $t_n$ is calculated by subtracting the second-order difference $\Delta^2 Vte(t_{n-1})$ at the time $t_{n-1}$ from the second-order difference $\Delta^2 Vte(t_n)$ at the time $t_n$. Similarly, the fourth-order difference $\Delta^4 Vte(t_n)$ at the time $t_n$ is calculated by subtracting the third-order difference $\Delta^3 Vte(t_{n-1})$ at the time $t_{n-1}$ from the third-order difference $\Delta^3 Vte(t_n)$ at the time $t_n$.

In this embodiment, the input data generation unit 132 determines the fourth-order difference $\Delta^4 Vte$ of the terminal voltage Vte at each time to be the voltage difference $\delta Vte$. In other words, $$\delta Vte(t) = \Delta^4 Vte(t)$$

where $t = t_n, t_{n-1}, \ldots$

[2.2.2.3. Calculation of Difference Gradient Sdiff]

The difference gradient Sdiff is the change rate of the voltage difference $\delta Vte$ with respect to the current difference $\delta Ite$ in the period to the present from the past that goes back the predetermined time T1 from the present. Specifically, as shown in FIGS. 4 and 5, the input data generation unit 132 extracts k1 (k1=n−m+1) of current differences $\delta Ite$ and k1 of voltage differences $\delta Vte$ between the past time $t_m$ and the present time $t_n$, which corresponds to the period to the present from the past that goes back the predetermined time T1 from the present. Then, the input data generation unit 132 uses the data set ($\delta Ite$, $\delta Vte$) each time configured of the extracted $\delta Ite$ and $\delta Vte$ to calculates the difference gradient Sdiff by the least squares method. The difference gradient Sdiff is the change rate of the voltage difference $\delta Vte$ with respect to the current difference $\delta Ite$.

Figure 6:
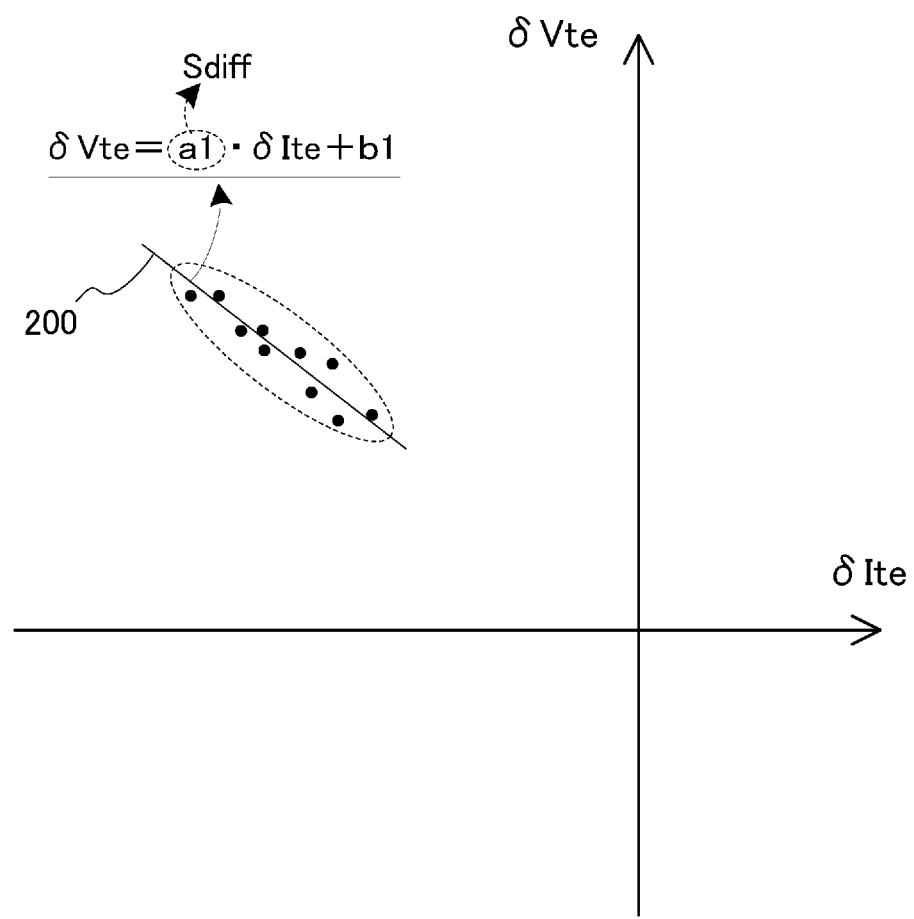
FIG. 6 is a diagram for describing a calculation of a difference gradient in the processes shown in FIG. 3.

More specifically, as shown in FIG. 6, the above k1 of data sets ($\delta Ite$, $\delta Vte$) are plotted on a two-dimensional plane having the current difference $\delta Ite$ as the horizontal axis and the voltage difference $\delta Vte$ as the vertical axis. The plot is represented by a black circle in the illustrated dotted ellipse. The slope of the approximate straight line (regression straight line) 200 of this plot corresponds to the difference gradient Sdiff. In other words, when the approximate straight line 200 is given by $\delta Vte = a1 \times \delta Ite + b1$, the slope a1 of the approximate straight line 200 corresponds to the difference gradient Sdiff. Here, the approximate straight line is calculated by, for example, the least squares method.

[2.2.2.4. Calculation of Integrated Current Value $\Sigma Ite$, Open Circuit Voltage Change Amount Dvoc, and Difference Gradient Change Amount Dsd]

The following describes the calculation of the integrated current value $\Sigma Ite$, the open circuit voltage change amount Dvoc, and the difference gradient change amount Dsd.

Figure 7:
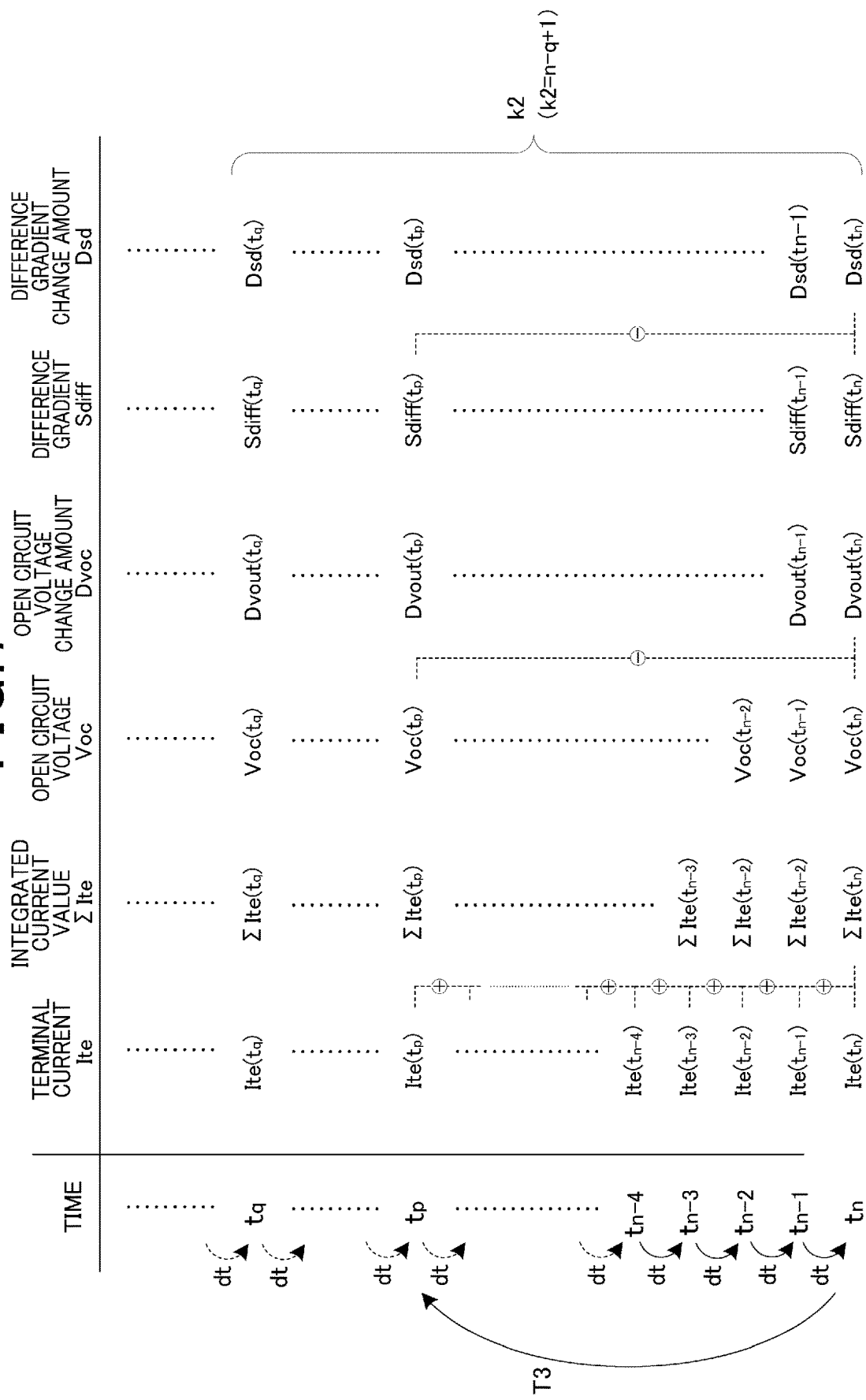
FIG. 7 is a diagram for describing calculations of an integrated current value, an open circuit voltage change, and a difference gradient change amount in the processes shown in FIG. 3.

FIG. 7 is a diagram for explaining the calculation of the integrated current value $\Sigma Ite$, the open circuit voltage change amount Dvoc, and the difference gradient change amount Dsd. In the table shown in FIG. 7, the leftmost column is the first column, and toward the right, there are the second column, the third column, and finally the seventh column. The first column of the table of FIG. 7 indicates the time when the state variable measuring unit 130 repeatedly acquires the terminal current Ite at the time interval dt or the index (number) of the time. The second column is the time-series data of the terminal currents Ite, and indicates the terminal current Ite acquired at each time. The third column indicates the integrated current values $\Sigma Ite$ calculated from the time-series data of the terminal currents Ite in the second column.

The fourth column is the time-series data of the open circuit voltages Voc, and indicates the open circuit voltage Voc acquired at each time. In this embodiment, the open circuit voltage Voc is calculated and acquired using the trained open circuit voltage estimation model 124. The fifth column indicates the open circuit voltage change amounts Dvoc calculated from the time-series data of the open circuit voltages Voc in the fourth column.

The sixth column indicates the difference gradients Sdiff calculated as described above, and the seventh column indicates the difference gradient change amounts Dsd calculated from the time-series data of the difference gradients Sdiff in the sixth column.

The integrated current value $\Sigma Ite(t_n)$ at the present time $t_n$ is the sum of the terminal currents Ite measured in the period to the present time $t_n$ from time $t_p$ in the past that goes back the predetermined time T3 from the present, and is calculated by the following expression.

[Expression 1]

$$\sum Ite(t_n) = Ite(t_p) + Ite(t_{p+1}) + \ldots + Ite(t_{n-1}) + Ite(t_n) = \sum_{t_i=t_p}^{t_n} Ite(t_i)$$

The open circuit voltage change amount $Dvoc(t_n)$ at the present time $t_n$ is a value obtained by subtracting the open circuit voltage $Voc(t_p)$ at time $t_p$ in the past that goes back the predetermined time T3 from the present, from the open circuit voltage $Voc(t_n)$ at the present time $t_n$, and is calculated by the following expression.

$$Dvoc(t_n) = Voc(t_n) - Voc(t_p)$$

The difference gradient change amount $Dsd(t_n)$ at the present time $t_n$ is a value obtained by subtracting the difference gradient $Sdiff(t_p)$ at time $t_p$ in the past that goes back the predetermined time T3 from the present, from the difference gradient $Sdiff(t_n)$ at the present time $t_n$, and is calculated by the following expression.

$$Dsd(t_n) = Sdiff(t_n) - Sdiff(t_p)$$

[2.2.2.5. Voltage Estimation Input Data]

As described above, the voltage estimation input data is configured of time-series data of the terminal currents Ite, the terminal voltages Vte, and the difference gradients Sdiff in the period to the present from the past that goes back the predetermined time T2 from the present. Assuming that the present time is $t_n$ and the past time that goes back the predetermined time T2 from the present is $t_r$, the voltage estimation input data is expressed by the following expression.

[Expression 2]

$$v_{x1(t_n)} = \begin{pmatrix} v_{Ite(t_n)} \\ v_{Vte(t_n)} \\ v_{Sdiff(t_n)} \end{pmatrix} \quad (1)$$

where $v_{Ite(t_n)} = (Ite(t_r), Ite(t_{r+1}), Ite(t_{r+2}), \ldots, Ite(t_n))$ $v_{Vte(t_n)} = (Vte(t_r), Vte(t_{r+1}), Vte(t_{r+2}), \ldots, Vte(t_n))$ $v_{Sdiff(t_n)} = (Sdiff(t_r), Sdiff(t_{r+1}), Sdiff(t_{r+2}), \ldots, Sdiff(t_n))$.

Here, the time-series data $'Ite(t_n)$ of the terminal currents Ite, the time-series data $'Vte(t_n)$ of the terminal voltages Vte, and the time-series data $'Sdiff(t_n)$ of the difference gradients Sdiff are respectively first-order tensors having n−r+1 values of terminal current Ite, terminal voltage Vte, and difference gradient Sdiff from time $t_r$ to time $t_n$ as elements. Therefore, the voltage estimation input data $^vx1(t_n)$ is a second-order tensor.

[2.2.2.6. State Estimation Input Data]

As described above, the state estimation input data includes time-series data of: the difference gradients Sdiff; the open circuit voltages Voc; the integrated current values ΣIte; the open circuit voltage change amounts Dvoc; and the difference gradient change amounts Dsd, in the period to the present from the past that goes back the predetermined time T4 from the present. Assuming that the time of the present is $t_n$ and the time of the past that goes back the predetermined time T4 from the present is $t_s$, the state estimation input data is expressed by the following expression.

[Expression 3]

$$v_{x2(t_n)} = \begin{pmatrix} v_{Sdiff(t_n)} \\ v_{Voc(t_n)} \\ v_{\Sigma Ite(t_n)} \\ v_{Dvoc(t_n)} \\ v_{Dsd(t_n)} \end{pmatrix} \quad (2)$$

where $v_{Sdiff(t_n)} = (Sdiff(t_s), Sdiff(t_{s+1}), Sdiff(t_{s+2}), \ldots, Sdiff(t_n))$ $v_{Voc(t_n)} = (Voc(t_s), Voc(t_{s+1}), Voc(t_{s+2}), \ldots, Voc(t_n))$ $v_{\Sigma Ite(t_n)} = (\sum Ite(t_s), \sum Ite(t_{s+1}), \sum Ite(t_{s+2}), \ldots, \sum Ite(t_n))$ $v_{Dvoc(t_n)} = (Dvoc(t_s), Dvoc(t_{s+1}), Dvoc(t_{s+2}), \ldots, Dvoc(t_n))$ $v_{Dsd(t_n)} = (Dsd(t_s), Dsd(t_{s+1}), Dsd(t_{s+2}), \ldots, Dsd(t_n))$.

Here, time-series data $^vSdiff(t_n)$ of the difference gradients Sdiff, time-series data $^vVoc(t_n)$ of the open circuit voltages Voc, time-series data $^v\Sigma Ite(t_n)$ of the integrated current values ΣIte, time-series data $^vDvoc(t_n)$ of the open circuit voltage change amounts Dvoc, time-series data $^vDsd(t_n)$ of the difference gradient change amounts Dsd are respectively a first-order tensor having n−s+1 values of the difference gradients Sdiff, the open circuit voltages Voc, the integrated current values ΣIte, the open circuit voltage change amounts Dvoc, and the difference gradient change amounts Dsd, from time $t_s$ to time $t_n$, as the elements. Therefore, the state estimation input data $^vx2(t_n)$ is a second-order tensor.

[2.3. Functions of Model Learning Unit]

The model learning unit 134 generates an open circuit voltage estimation model 124 by machine learning. In addition, the model learning unit 134 executes the step S104 shown in FIG. 1 to train the state estimation model 126 by machine learning.

[2.3.1. Generation of Open Circuit Voltage Estimation Model]

The model learning unit 134 uses the voltage estimation input data (described above) generated by the input data generation unit 132, and thereby generates the open circuit voltage estimation model 124 by machine learning. At that time, the model learning unit 134 acquires, for example, the time-series data of the open circuit voltages Voc of the secondary battery 102 from the learning management device 112, and performs the machine learning using the acquired time-series data of the open circuit voltages Voc as teacher data.

Figure 8:
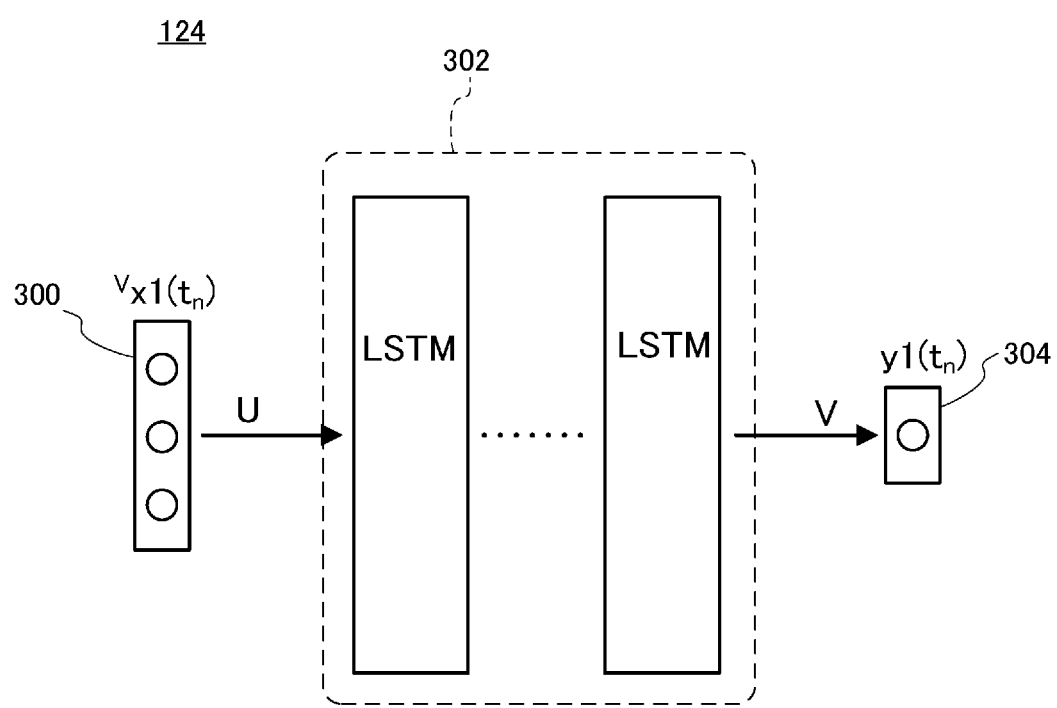
FIG. 8 is a diagram showing an example of the configuration of the open circuit voltage estimation model generated by the model learning unit of the machine learning device shown in FIG. 2.

FIG. 8 is a diagram showing the configuration of the open circuit voltage estimation model 124 generated by the model learning unit 134. The open circuit voltage estimation model 124 is configured of a neural network and has an input layer 300, an intermediate layer 302, and an output layer 304. The open circuit voltage estimation model 124 is, for example, an RNN (Recurrent Neural Network).

The input layer 300 receives the voltage estimation input data of the second-order tensor represented by the above expression (1). In this embodiment, the intermediate layer 302 includes an LSTM (Long Short Term Memory) configured in multiple layers. However, the intermediate layer 302 is not limited to the LSTM. For example, the intermediate layer 302 may be configured of a GRU (Gated Recurrent Unit).

The output layer 304 outputs the estimated value of the open circuit voltage Voc at the time $t_n$ of the secondary battery 102 as the output $y1(t_n)$. In other words, the output $y1(t_n)$ is an open circuit voltage $Voc(t_n)$ as a scalar quantity.

[2.3.2. Generation of State Estimation Model]

The model learning unit 134 executes the step S104 shown in FIG. 1 to train the state estimation model 126 by machine learning using the state estimation input data generated by the input data generation unit 132. At that time, the model learning unit 134 acquires, for example, the time-series data of the SOCs and SOHs of the secondary battery 102 calculated by the learning management device 112, and uses the acquired time-series data of the SOCs and SOHs as teacher data to perform the above machine learning.

Figure 9:
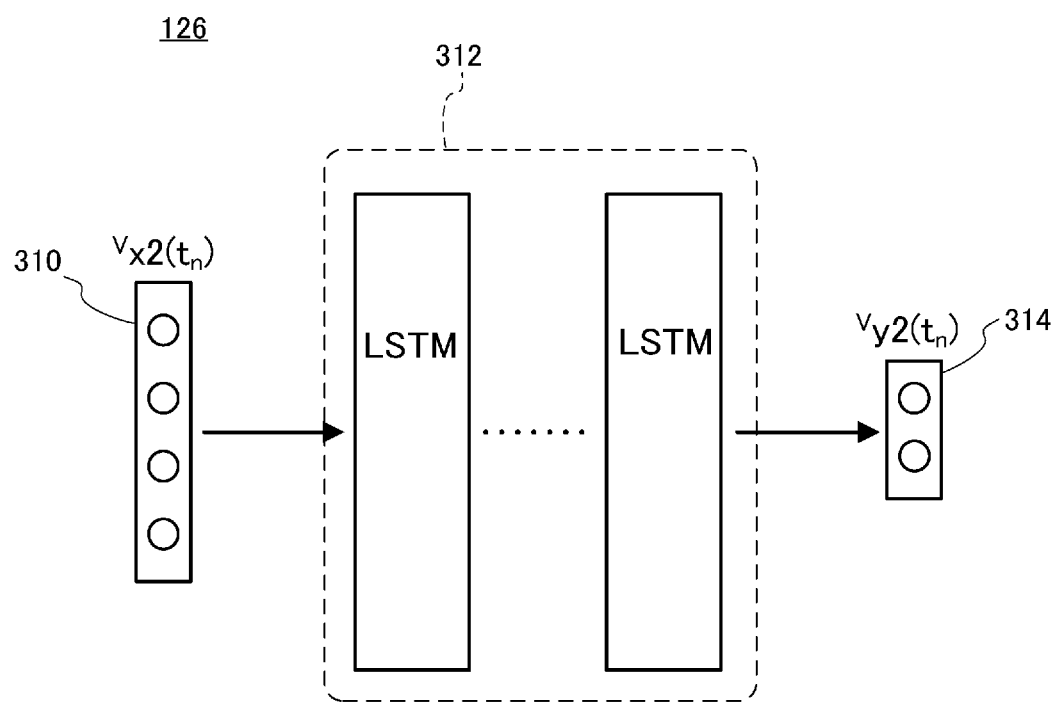
FIG. 9 is a diagram showing an example of the configuration of the state estimation model generated by the model learning unit of the machine learning device shown in FIG. 2.

FIG. 9 is a diagram showing a configuration of the state estimation model 126 generated by the model learning unit 134. The state estimation model 126 is configured of a neural network having an input layer 310, an intermediate layer 312, and an output layer 314. For example, the state estimation model 126 is an RNN.

The input layer 310 receives the state estimation input data of the second-order tensor represented by the above expression (2). The intermediate layer 312 includes an LSTM configured in multiple layers in this embodiment. However, the intermediate layer 312 is not limited to LSTM. For example, the intermediate layer 312 may be configured of GRU.

The output layer 314 outputs the estimated value of SOC and the estimated value of SOH at the time $t_n$ of the secondary battery 102 as the output $^vy2(t_n)$. In other words, the output $^vy2(t_n)$ is a first-order tensor whose elements are $SOC(t_n)$ and $SOH(t_n)$, which are scalar quantities.

The open circuit voltage estimation model 124 and the state estimation model 126 generated as described above do not take input of the terminal current Ite and terminal voltage Vte of the secondary battery as they are, and takes input of the difference gradient Sdiff, which is the change gradient of the voltage difference δVte calculated from the time-series data of the terminal voltages Vte, with respect to the current difference δIte calculated from the time-series data of the terminal currents Ite. In other words, the open circuit voltage estimation model 124 and the state estimation model 126 do not learn the relationship of the change mode of the terminal current Ite and the terminal voltage Vte themselves with the SOC and the like, and learn the change mode of the change of the terminal current Ite and the terminal voltage Vte, that is, the relationship of the high-order change mode with the SOC and the like.

As described above, such a high-order change mode of the terminal current and the terminal voltage has a correlation with the internal state of the secondary battery, at least among the secondary batteries in the same type (for example, the secondary batteries in "lithium ion battery" that are identical as the type). Therefore, the open circuit voltage estimation model 124 and the state estimation model 126 generated as described above can accurately estimate open circuit voltages of secondary batteries with various electrical characteristics of different manufacturers and models, and charge rates (SOC) and/or deterioration degrees (SOH) thereof in operation of these secondary batteries.

[3. Secondary Battery Used for Model Learning]

The secondary batteries 102 used for the model learning are desirably a plurality of various secondary batteries having different manufacturers and models, and different electrical characteristics. This can generate an open circuit voltage estimation model 124 and a state estimation model 126 in which the estimation accuracy does not change much for manufacturers and models. For example, in training the open circuit voltage estimation model 124 and the state estimation model 126, it is desirable to use a plurality of secondary batteries having different electrical characteristics such as SOC-OCV characteristics, SOC-internal impedance characteristics, and/or their SOH dependence.

[4. Operation Mode of Secondary Battery in Model Learning]

The operation mode (charge-discharge story) of the secondary battery in model learning is desirably not only monotonously discharging or charging between a fully charged state (SOC=100%) and a fully discharged state (SOC=0%), but also randomly charging and discharging, and/or alternately charging and discharging according to predetermined criteria. Such predetermined criteria can be a standard according to the use of the secondary battery to be estimated. For example, when a secondary battery for a vehicle is to be estimated, the criteria to be used can adjust to follow the typical charge-discharge cycle in vehicle driving in various traffic scenes such as urban areas, mountainous areas, rural areas, and highways.

[5. Collection of Learning Data]

In this embodiment, the state variables (Ite, Vte) of the secondary battery 102, which is the source of the learning data of the open circuit voltage estimation model 124 and the state estimation model 126, and the time-series data of SOCs and SOHs, which are teacher data, are acquired from the characteristic measuring instrument 110 by the machine learning device 100, and are calculated by the learning management device 112 and immediately used for training the open circuit voltage estimation model 124 or the state estimation model 126. However, the time-series data of these state variables and teacher data do not necessarily need to be used immediately for learning.

The time-series data of the state variables and the time-series data of the teacher data may be acquired and stored in advance by the learning management device 112 operating the secondary battery. The machine learning device 100 may acquire the time-series data of the state variables and the time-series data of the teacher data stored in the learning management device 112 from the learning management device 112, and train the open circuit voltage estimation model 124 and the state estimation model 126.

In addition, the time-series data of the state variables and the time-series data of the teacher data may be generated by a computer simulating the charge-discharge characteristics obtained from the design data such as the equivalent circuit of the secondary battery 102, as long as the error from the actual data is within a range that has no practical problem.

[6. Example of State Estimation by State Estimation Model]

Figure 10:
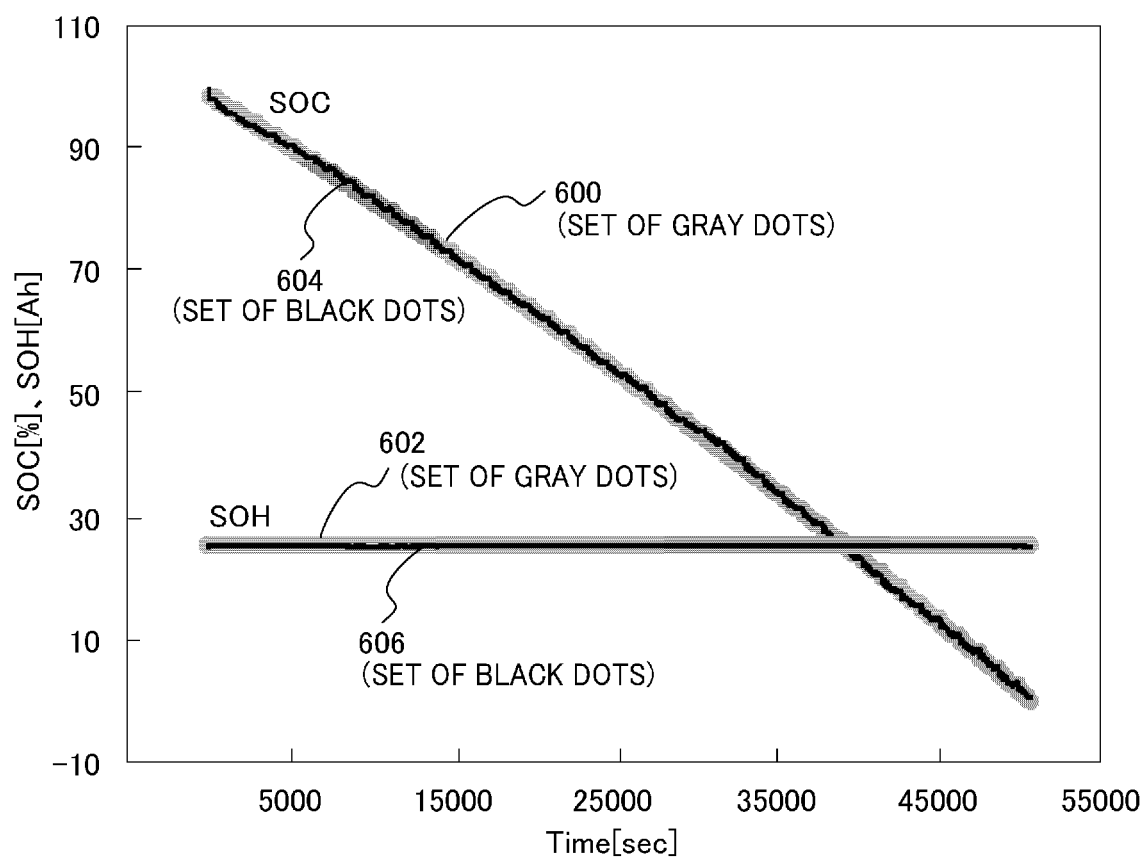
FIG. 10 is a diagram showing an example of a state estimation of a secondary battery performed using a trained open circuit voltage estimation model and a trained state estimation model.

The following describes an example of state estimation of the secondary battery using the trained state estimation model by the learning method according to this embodiment. FIG. 10 is a diagram showing an example of state estimation of a secondary battery performed using a trained open circuit voltage estimation model and a state estimation model.

The training data for the open circuit voltage estimation model and the state estimation model are both generated by a computer simulating the charge-discharge characteristics of sample secondary batteries, for vehicles, in dozens of types with different electrical characteristics. Specifically, the above computer simulation calculates the terminal current Ite and terminal voltage Vte, and SOC and SOH at each predetermined time interval dt in charging and discharging according to a predetermined charge-discharge story, for each of the sample secondary batteries in dozens of types with different electrical characteristics, which are SOC-OCV characteristics, internal impedance characteristics, and capacitive characteristics (SOH).

The above charge-discharge story includes: not only monotonously discharging or charging the sample secondary batteries between a fully charged state (SOC=100%) and a fully discharged state (SOC=0%); but also adjusting to follow the typical charge-discharge cycle in vehicle driving in various traffic scenes such as urban areas, mountainous areas, rural areas, and highways.

The sample secondary batteries are lithium ion batteries. The measurement interval dt of the state variable is 100 ms. The predetermined times T1, T2, T3, and T4 in calculating the voltage estimation input data and the state estimation input data of the open circuit voltage estimation model and the state estimation model described above are respectively 5 seconds, 5 seconds, 300 seconds, and 5 seconds. Note that the numerical values of these times are an example, and the predetermined times T1, T2, T3, and T4 may be set to different time values from the above.

FIG. 10 shows the estimation result of SOC and SOH using the trained state estimation model and the simulated value of SOC and SOH of one secondary battery, randomly chosen from the above sample secondary batteries to be the secondary battery to be estimated (hereinafter, the target secondary battery), in discharging the target secondary battery from the fully charged state to the fully discharged state.

In FIG. 10, the horizontal axis represents the elapsed time after the start of discharging when the secondary battery starts discharging from the fully charged state, and the vertical axis represents SOC (%) and SOH (capacity Ah at the time of full charge) of the target secondary battery. The state estimation input data given to the state estimation model in the estimation of SOC and SOH is calculated based on Ite and Vte for each predetermined time interval dt at the time of discharging the target secondary battery. The Ite and Vte are calculated from the charge-discharge characteristics of the target secondary battery by simulation.

In FIG. 10, lines 600 and 602 each formed by a set of gray dots are respectively the SOC estimated values and the SOH estimated values estimated by the state estimation model. Lines 604 and 606 each formed by a set of black dots are respectively SOC and SOH calculated by simulation from the charge-discharge characteristics of the target secondary battery.

The contrast between the line 600 and the line 604 and the contrast between the line 602 and the line 606 shown in FIG. 10 shows that the state estimation model trained by the learning method shown in this embodiment accurately estimates the SOC and SOH of the target secondary battery. In particular, although the state estimation model used for this estimation is generated using learning data for the sample secondary batteries in dozens of types with different electrical characteristics, the estimated values of SOC and SOH each focuses on one line (line 600 and line 602) without divergence, and accurately estimates the SOC and SOH for a specific target secondary battery. This indicates that the state estimation method of this embodiment, which performs learning using a plurality of secondary batteries with different electrical characteristics, can accurately estimate the state, that is, SOC and SOH of a variety of operating secondary batteries having different manufacturers and models.

Second Embodiment

Figure 11:
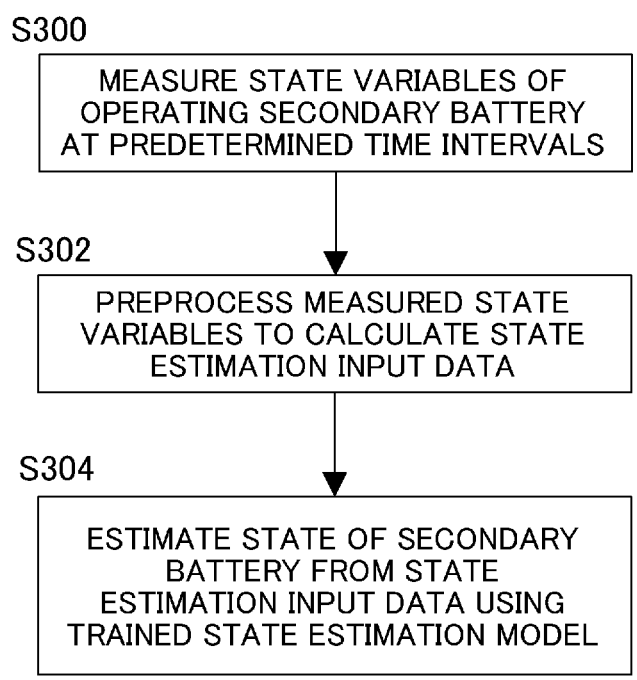
FIG. 11 is a flow chart showing a procedure of a state estimation method according to a second embodiment of the present invention.

The following describes a second embodiment of the present invention. FIG. 11 is a diagram showing a procedure of a secondary battery state estimation method according to an embodiment of the present invention. This state estimation method includes: a step (S300) of measuring state variables including terminal currents and terminal voltages of an operating secondary battery to which a load or a charger is connected, at predetermined time intervals; and a step (S302) of preprocessing the measured state variables to calculate state estimation input data. In addition, this state estimation method includes a step (S304) of estimating a state of the operating secondary battery from the state estimation input data, using the state estimation model trained by the learning method according to the first embodiment described above. The above states are SOC and SOH in this embodiment.

Figure 12:
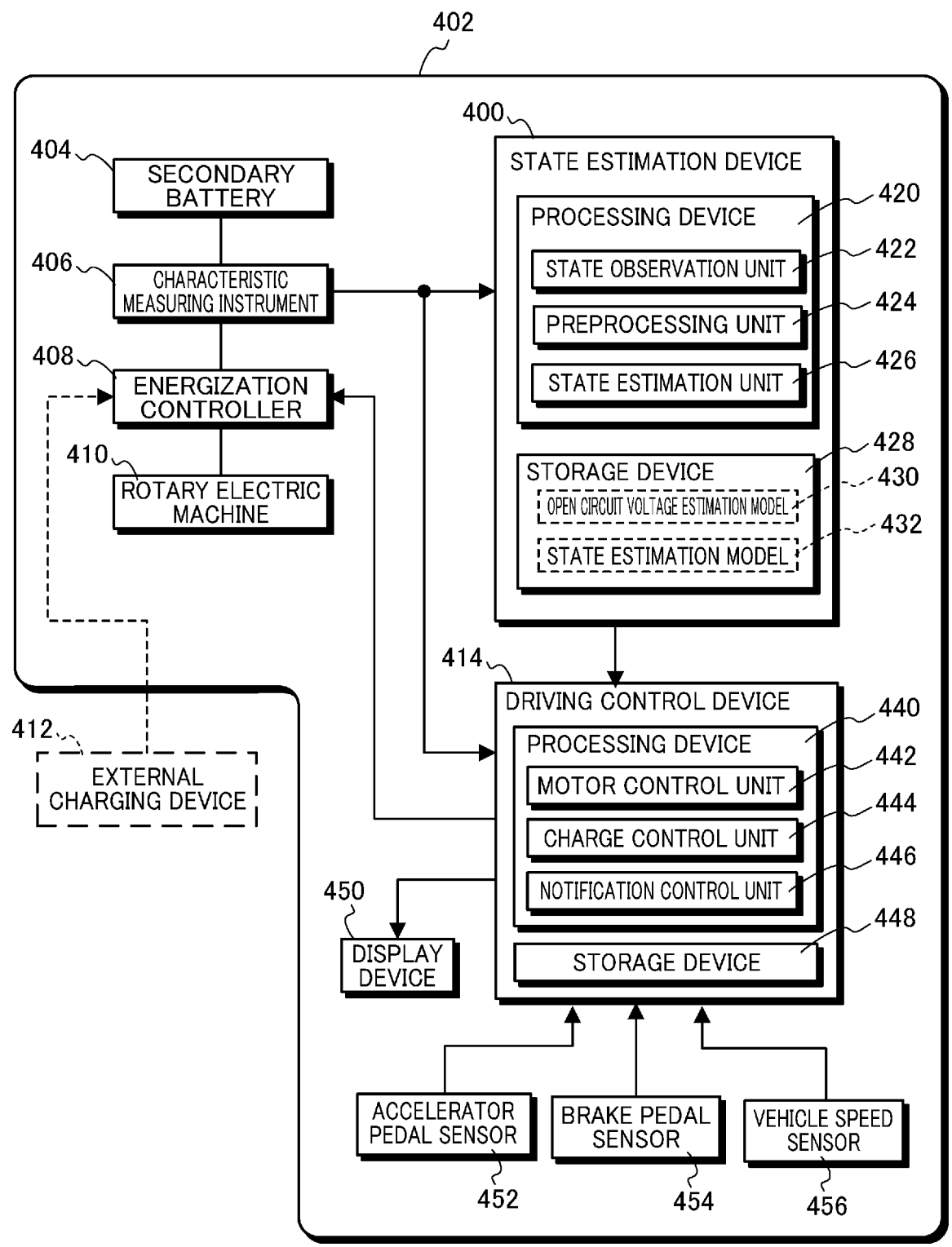
FIG. 12 is a diagram showing a configuration of a state estimation device that executes the state estimation method shown in FIG. 11.

The state estimation method shown in FIG. 11 is executed, for example, in a state estimation device 400 shown in FIG. 12. The state estimation device 400 estimates the state of the secondary battery 404, which is mounted on a vehicle 402 that is an electric vehicle and is operating as an in-vehicle battery of the vehicle 402, for example. The secondary battery 404 is connected to a rotary electric machine 410 via a characteristic measuring instrument 406 and an energization controller 408.

The rotary electric machine 410 functions as a motor that is powered by the discharge from the secondary battery 404 to drive the wheels of the vehicle 402, and also functions as a generator that generates electricity by the rotational force transmitted from the wheels and charges the secondary battery 404.

The characteristic measuring instrument 406 measures the present value of the state variable including the terminal current Ite and the terminal voltage Vte of the secondary battery 404. The energization controller 408 controls the amount of electricity from the secondary battery 404 to the rotary electric machine 410 and the amount of electricity from the rotary electric machine 410 to the secondary battery 404 under the control of a driving control device 414 mounted on the vehicle 402. When an external charging device 412 outside the vehicle 402 is connected to the vehicle 402, the energization controller 408 controls the amount of electricity supplied from the external charging device 412 to the secondary battery 404 under the control of the driving control device 414. The external charging device 412 is, for example, a charger in a charging stand. The energization controller 408 can also control the amount of electricity from the generator to the secondary battery when another generator driven by the internal combustion engine is mounted on the vehicle 402.

The driving control device 414 acquires the estimated values of the present SOC and SOH indicating the state of the secondary battery 404 from the state estimation device 400, and uses the acquired SOC and SOH to control the operation of the rotary electric machine 410 and notify the user.

Specifically, the driving control device 414 has a processing device 440 and a storage device 448. The storage device 448 is, for example, a semiconductor memory, and stores data necessary for processing in the processing device 440.

The processing device 440 is, for example, a computer including a processor such as a CPU. The processing device 440 may be configured to include a ROM in which a program is written, and a RAM for temporarily storing data. The processing device 440 includes a motor control unit 442, a charge control unit 444, and a notification control unit 446, as functional elements or functional units.

These functional elements included in the processing device 440 are embodied, for example, by the processing device 440, which is a computer, executing a program. Note that the computer program can be stored in any computer-readable storage medium. Alternatively, all or part of the functional elements included in the processing device 440 may be configured by hardware including one or more electronic circuit components.

The motor control unit 442 detects the amount of depression of the accelerator pedal (not shown) of the vehicle 402 from the accelerator pedal sensor 452. When the accelerator pedal is depressed, the driving control device 414 instructs the energization controller 408 to energize the rotary electric machine 410 from the secondary battery 404, and operates the rotary electric machine 410 as a motor to drive the vehicle 402. Furthermore, driving control device 414 controls the rotation speed of the rotary electric machine 410 via the energization controller 408 so that the speed of the vehicle 402 acquired from the vehicle speed sensor 456 is a speed corresponding to the amount of depression of the accelerator pedal.

At that time, the motor control unit 442 uses the estimated value of the present SOC acquired from the state estimation device 400, to limit the upper limit value (maximum flowing current) of the current flowing from the secondary battery 404 to the rotary electric machine 410, for example, when the vehicle 402 is accelerating or traveling at a constant speed. In other words, for example, the motor control unit limits the torque generated by the rotary electric machine 410 to limit the discharge of the secondary battery 404. For that, the motor control unit determines the maximum flowing current so that the fuel efficiency (for example, the mileage per 1 kWh) determined from the characteristics of the secondary battery 404 and the rotary electric machine 410 is not less than a predetermined value.

The charge control unit 444 determines whether the brake pedal (not shown) of the vehicle 402 is depressed by the brake pedal sensor 454. Then, when the brake pedal is depressed, the charge control unit 444 instructs the motor control unit 442 to stop the energization from the secondary battery 404 to the rotary electric machine 410. Then, the charge control unit 444 instructs the energization controller 408 to energize the secondary battery 404 from the rotary electric machine 410 to operate the rotary electric machine 410 as a generator, and thereby charges the secondary battery 404 from the rotary electric machine 410, which is called regenerative braking operation.

Furthermore, when the external charging device 412 is connected to the vehicle 402, the charge control unit 444 controls the amount of power supplied from the external charging device 412 to the secondary battery 404 via the energization controller 408.

The notification control unit 446 uses the present SOC estimated value and the SOH estimated value acquired from the state estimation device 400, to make a predetermined display on the display device 450. For example, the notification control unit 446 simply displays the acquired present SOC estimated value and SOH estimated value on the display device 450. Alternatively, for example, the notification control unit 446 displays a message, on the display device 450, suggesting that the driver charge the vehicle 402 at the charging stand when the SOC estimated value falls below a predetermined value. Alternatively, for example, the notification control unit 446 displays a message, on the display device 450, suggesting the driver of the vehicle 402 to replace the secondary battery 404 when the SOH estimated value falls below a predetermined value.

The state estimation device 400 executes the state estimation method of the secondary battery shown in FIG. 11 to estimate the SOC and SOH of the operating secondary battery 404, and outputs the present SOC estimated value and SOH estimated value to the driving control device 414.

Specifically, the state estimation device 400 has a processing device 420 and a storage device 428. The storage device 428 is composed of a non-volatile and volatile semiconductor memory. The storage device 428 stores the open circuit voltage estimation model 124 and the state estimation model 126 trained by the learning method shown in the first embodiment, in advance, as the open circuit voltage estimation model 430 and the state estimation model 432, respectively.

The processing device 420 is, for example, a computer including a processor such as a CPU. The processing device 420 may be configured to include a ROM in which a program is written, and a RAM for temporarily storing data. The processing device 420 includes a state observation unit 422, a preprocessing unit 424, and a state estimation unit 426 as functional elements or functional units.

These functional elements included in the processing device 420 are embodied, for example, by the processing device 420, which is a computer, executing a program. Note that the computer program can be stored in any computer-readable storage medium. Alternatively, all or part of the functional elements included in the processing device 420 may be configured by hardware including one or more electronic circuit components.

Figure 13:
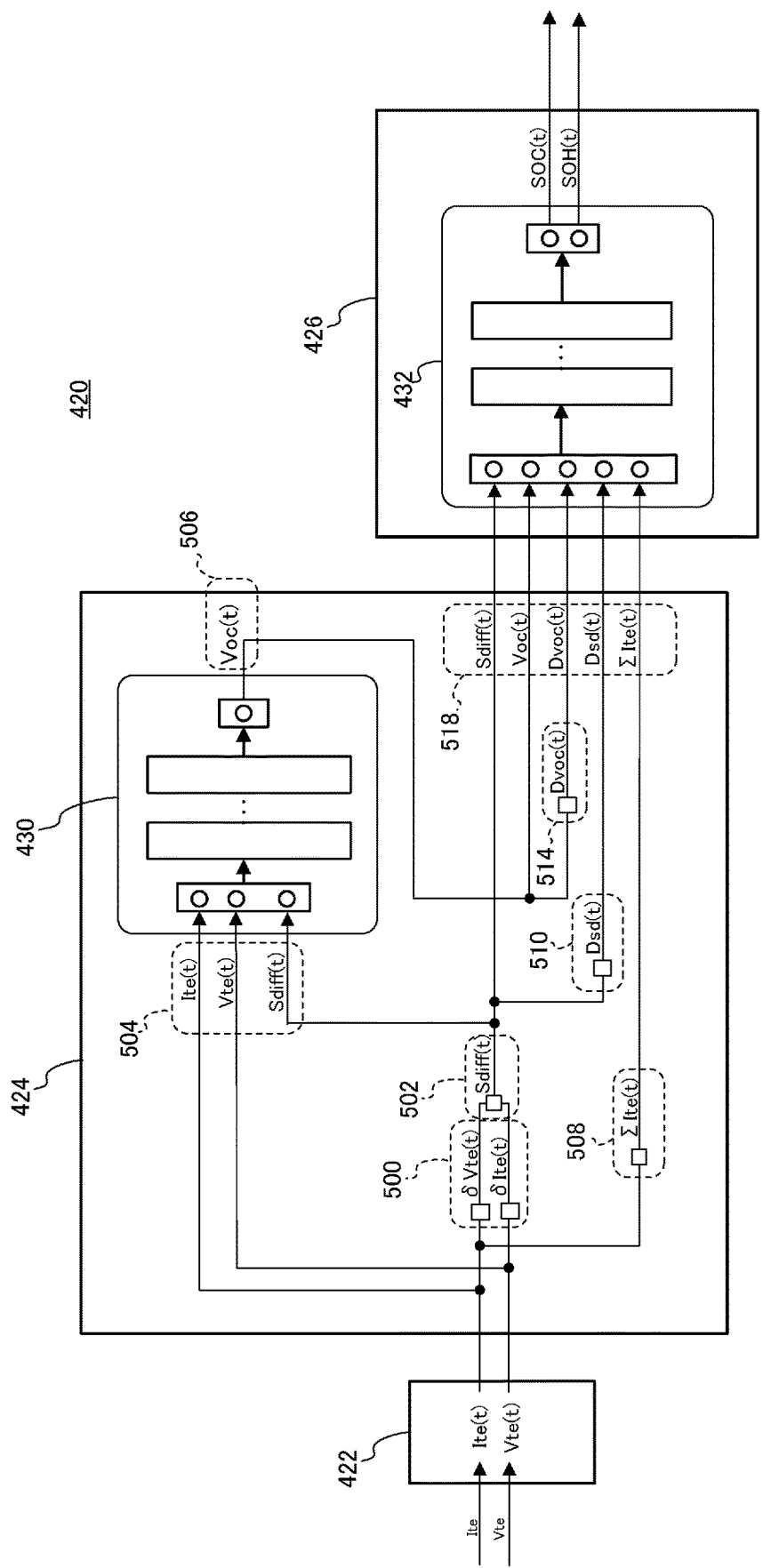
FIG. 13 is a functional block diagram of a processing device included in the state estimation device shown in FIG. 12.

FIG. 13 shows a functional block diagram of the processing device 420 having the state observation unit 422, the preprocessing unit 424, and the state estimation unit 426. In FIG. 13, the dotted rectangles each indicate processing in the preprocessing unit 424.

The state observation unit 422 executes the step S300 shown in FIG. 11. Specifically, the state observation unit 422 acquires the state variables of the secondary battery 404 including the terminal currents Ite(t) and the terminal voltages Vte(t) of the operating secondary battery 404, from the characteristic measuring instrument 406 at predetermined time intervals. As a result, the state observation unit 422 obtains time-series data of the state variables measured at predetermined time intervals.

The preprocessing unit 424 executes the step S302 shown in FIG. 11. Specifically, the preprocessing unit 424 preprocesses the state variables acquired by the state observation unit 422, and calculates the state estimation input data for the state estimation model 432. Specifically, the preprocessing unit 424 uses the time-series data of the terminal currents Ite and the time-series data of the terminal voltages Vte acquired by the state observation unit 422, to calculate the current difference $\delta$Ite, which is the difference of the terminal currents Ite, and the voltage difference $\delta$Vte, which is the difference of the terminal voltages Vte (process 500 shown in FIG. 13). Then, the preprocessing unit 424 calculates the difference gradient Sdiff, which is the change rate of the voltage difference $\delta$Vte with respect to the current difference $\delta$Ite (process 502 shown in FIG. 13).

In addition, the preprocessing unit 424 input the time-series data of each of the terminal currents Ite, the terminal voltages Vte, and the above-calculated Sdiff in the period to the present from the past that goes back a predetermined time T2 from the present, to the open circuit voltage estimation model 430 (process 504 in FIG. 13). Then, the preprocessing unit 424 calculates the estimated value of the present open circuit voltage Voc of the secondary battery 404 by the open circuit voltage estimation model 430 (process 506 in FIG. 13).

Furthermore, the preprocessing unit 424 calculates the integrated current value $\Sigma$Ite, which is the sum of the terminal currents Ite acquired continuously in the period to the present from the past that goes back the predetermined time T3 from the present (process 508 in FIG. 13). Furthermore, the preprocessing unit 424 calculates the difference gradient change amount Dsd obtained by subtracting the difference gradient Sdiff in the past that goes back the predetermined time T3 from the present, from the present difference gradient Sdiff (process 510 in FIG. 13).

Furthermore, the preprocessing unit 424 subtracts the open circuit voltage Voc in the past that goes back the predetermined time T3 from the present, from the present open circuit voltage Voc, to calculate the open circuit voltage change amount Dvoc (process 514 in FIG. 13).

Then, the preprocessing unit 424 uses time-series data of: the difference gradients Sdiff; the open circuit voltages Voc; the open circuit voltage change amounts Dvoc; the difference gradient change amounts Dsd; and the integrated current values $\Sigma$Ite, in the period to the present from the past that goes back the predetermined time T4 from the present, as the state estimation input data of the state estimation model 432 (process 518 in FIG. 13).

Note that the preprocessing unit 424 has: specific methods of calculating the current difference $\delta$Ite, the voltage difference $\delta$Vte, difference gradient Sdiff, the open circuit voltage change amount Dvoc, the integrated current value $\Sigma$Ite, and the difference gradient change amount Dsd; and the configurations of the state estimation input data. Both the methods of calculating and configurations are the same as those described in the first embodiment.

The state estimation unit 426 executes the step S304 shown in FIG. 11. Specifically, the state estimation unit 426 uses the state estimation input data calculated by the preprocessing unit 424 to estimate SOC and SOH, as the present state of the secondary battery 404, by the trained state estimation model 432. The state estimation unit 426 outputs the estimated present SOC and SOH values to the driving control device 414, as the SOC estimated value and the SOH estimated value.

The present invention is not limited to the configuration of the above embodiments, and can be implemented in various aspects without departing from the gist thereof.

For example, the machine learning device 100 in the first embodiment and the state estimation device 400 in the second embodiment described above use the trained open circuit voltage estimation model to acquire the open circuit voltage of the secondary battery required for learning or state estimation of the state estimation model. However, it is not essential to use the open circuit voltage estimation model in the acquisition of the open circuit voltage of the operating secondary battery in the first and second embodiments.

The open circuit voltage of the operating secondary battery may be acquired according to the prior art, for example, in the following way: an alternating current, which is a measurement signal, is input to the secondary battery 102 to measure the internal impedance Z; and the measured internal impedance Z, the present terminal current, terminal voltage, and load impedance are used for calculating the open circuit voltage of the operating secondary battery. Alternatively, the open circuit voltage of the operating secondary battery may be acquired, for example, in the following way: the temperature dependence of the typical internal impedance Z of the secondary battery and the present temperature are used for calculating the present internal impedance Z; and the calculated internal impedance Z and the present terminal current, terminal voltage, and load impedance are used for calculating the open circuit voltage of the operating secondary battery.

Furthermore, in the state estimation method of the operating secondary battery according to this embodiment, the state estimation model is trained to estimate both the SOC and the SOH of the secondary battery. However, the state estimation model may be trained to estimate only one of the SOC or SOH.

In addition, in the first embodiment, the state estimation input data to the state estimation model 126 are time-series data of: the difference gradients Sdiff; the open circuit voltages Voc; the integrated current values ΣIte; the open circuit voltage change amounts Dvoc; and the difference gradient change amounts Dsd. However, the state estimation input data may be only time-series data of the difference gradients Sdiff.

However, in order to accurately estimate SOC and SOH for a wider range of secondary batteries of different manufacturers and models, the state estimation input data desirably includes time-series data of the other four input variables (open circuit voltage Voc, integrated current value ΣIte, open circuit voltage change amount Dvoc, and difference gradient change amount Dsd) as well, for enabling the learning of the difference in SOC vs. OCV characteristics between secondary batteries of different models and the like.

Furthermore, the state estimation input data to the state estimation model 126 may additionally include the time-series data of terminal currents Ite in the period to the present from the past that goes back the predetermined time T5 from the present. This can further improve the accuracy of the state estimation of the secondary battery by the state estimation model. Here, the time-series data of the terminal currents Ite is expressed by the following expression.

$$^{\nu}Ite(t_n)=(Ite(t_s),Ite(t_{s+1}),Ite(t_{s+2}), \ldots, Ite(t_{s+2}), \ldots, Ite(t_n))$$ [Expression 4]

In addition, in this embodiment, the current difference δIte and the voltage difference δVte are respectively the fourth-order difference $\Delta^4 Ite$ of terminal current and the fourth-order difference $\Delta^4 Vte$ of terminal voltage. However, the current difference δIte and the voltage difference δVte do not necessarily need to be the fourth-order difference. If the current difference δIte and the voltage difference δVte are, for example, the first-order difference $\Delta^1 Ite$ and $\Delta^1 Vte$, the state estimation model 126 can learn the relationship of the behavior of the change (gradient) of the terminal current vs. the terminal voltage with the SOC and SOH. However, a fourth-order or higher-order difference can extract more common change modes of terminal current and terminal voltage among secondary batteries with different electrical characteristics. Therefore, the fourth-order or higher-order difference is preferable from the viewpoint of more accurately estimating SOC and SOH for secondary batteries of different manufacturers and models.

In addition, the input data of the open circuit voltage estimation model 124 and the state estimation model 126 may additionally include the time-series data of the temperatures of the secondary battery 102. This can further improve the estimation accuracy of SOC and SOH.

In addition, in the above-described embodiment, the open circuit voltage estimation model 124 and the state estimation model 126 is an RNN, which easily handles continuous data in chronological order as input. However, the configuration of the open circuit voltage estimation model and the state estimation model is not limited to the RNN.

For example, the open circuit voltage estimation model 124 and the state estimation model 126 may both be configured by a one-dimensional CNN (Convolutional Neural Network). Also in this case, the voltage estimation input data and the state estimation input data (expressions (1) and (2)) expressed by the second-order tensor can be input to the open circuit voltage estimation model 124 and the state estimation model 126, respectively.

Furthermore, in the above-described embodiment, an example of the device for executing the step S304 of estimating the state of the operating secondary battery is the state estimation device 400 for estimating the state of the operating secondary battery 404 that is mounted on the vehicle 402. However, the step S304 of estimating the state of the operating secondary battery is not limited to the secondary battery for vehicles, and can be used for estimating the state of a secondary battery used for any purpose such as a mobile phone, a bicycle, or a home.

Furthermore, in the above-described embodiment, the state estimation device 400 is embodied as one integrated device that only performs state estimation. However, this is only an example, and the step S304 of estimating the state of the operating secondary battery can be executed in another device having a function other than the state estimation of the secondary battery. For example, the step S304 of estimating the state of the operating secondary battery can be executed in the controller that controls the load of the secondary battery. As a specific example, in FIG. 12, for example, the state observation unit 422, the preprocessing unit 424, and the state estimation unit 426, which are included in the processing device 420 of the state estimation device 400, may be embodied by the processing device 440 of the driving control device 414. In this case, the open circuit voltage estimation model 430 and the state estimation model 432 stored in the storage device 428 are stored in the storage device 448 of the driving control device 414.

As described above, the learning method of the state estimation model of the secondary battery according to the first embodiment described above includes the step S100. The step S100 measures state variables including the terminal currents Ite and the terminal voltages Vte of the operating secondary battery 102 to which the load 106 or the charger 104 is connected, at each predetermined time interval dt. Furthermore, this learning method includes the step S102 and the step S104. The step S102 preprocesses the state variables to calculate state estimation input data. The step S104 trains the state estimation model 126 to learn the relationship of the state estimation input data with the charge rate SOC and/or deterioration degree SOH of the operating secondary battery 102, by machine learning. Then, the step S102 of calculating the state estimation input data uses the time-series data of the terminal currents Ite and the time-series data of the terminal voltages Vte to calculate a current difference δIte, and a voltage difference δVte. The current difference δIte is the difference of the terminal currents Ite, and the voltage difference δVte is the difference of the terminal voltages Vte. Furthermore, the step S102 uses the time-series data of the current differences δIte and the time-series data of the voltage differences δVte, to calculate the difference gradient Sdiff. The difference gradient Sdiff is the change rate of the voltage differences δVte with respect to the current differences δIte, in the period to the present from the past that goes back a first predetermined time T1 from the present. Then, the step S102 generates the state estimation input data 'x2($t_n$) including: time-series data 'Sdiff($t_n$) of the difference gradients Sdiff; time-series data 'Voc($t_n$) of the open circuit voltages Voc of the operating secondary battery; time-series data 'Dvoc($t_n$) of the open circuit voltage change amounts Dvoc each obtained by subtracting the open circuit voltage in the past that goes back the second predetermined time from the present, from the present open circuit voltage; time-series data 'Dsd($t_n$) of the difference gradient change amounts Dsd each obtained by subtracting the difference gradient in the past that goes back the second predetermined time from the present, from the present difference gradient; and time-series data 'ΣIte($t_n$) of the integrated current values ΣIte, each of which is a sum of the values of the terminal currents continuously acquired in the period to the present from the past that goes back the second predetermined time from the present.

This configuration can generate a state estimation model that can accurately estimate the state of charge rate and/or deterioration degree of secondary batteries with various electrical characteristics of different manufacturers and models while the secondary batteries are in operation.

In addition, the state estimation input data 'x2($t_n$) further includes time-series data 'Ite($t_n$) of the terminal currents Ite. This configuration can improve the estimation accuracy of the charge rate and/or the deterioration degree of the secondary battery by the generated state estimation model.

Furthermore, the step S102 of calculating the state estimation input data uses the time-series data 'Ite($t_n$) of the terminal currents Ite and the time-series data 'Vte($t_n$) of the terminal voltages Vte; and the time-series data 'Sdiff($t_n$) of the difference gradients Sdiff, as the voltage estimation input data, to estimate the open circuit voltage Voc of the operating secondary battery 404. Then, the step S102 calculates the state estimation input data 'x2($t_n$) using the above-estimated open circuit voltage Voc.

This configuration can accurately estimate the open circuit voltage of a secondary battery having various electrical characteristics of different manufacturers and models, and can further improve the estimation accuracy of the charge rate and/or the deterioration degree of the secondary battery of the state estimation model.

The difference gradient Sdiff is calculated using the least squares method. This configuration can prevent a decrease in the estimation accuracy of SOC and/or SOH due to a measurement error of a state variable in the generated state estimation model.

Furthermore, the current difference δIte and the voltage difference δVte are respectively the fourth-order difference $\Delta^4$Ite of the time-series data of the terminal currents Ite and the fourth-order difference $\Delta^4$Vte of the time-series data of the terminal voltages Vte. According to this configuration, the generated state estimation model uses higher-order change mode of the terminal currents Ite and terminal voltages Vte that secondary batteries with different electrical characteristics can have more commonly, and thereby can more accurately estimate SOC and/or SOH of secondary batteries with various electrical characteristics of different manufacturers and models.

The state estimation model 126 is configured of an RNN or a one-dimensional CNN. The intermediate layer of the RNN configuring the state estimation model 126 may be configured by an LSTM or a GRU. This configuration can efficiently handle the time-series data of a plurality of variables and effectively train the state estimation model.

The state estimation model 126 is generated by learning using time-series data of state variables including the terminal currents Ite and the terminal voltages Vte for each of the plurality of secondary batteries 102 having different electrical characteristics to which the load 106 or the charger 104 is connected. This configuration can generate a state estimation model capable of accurately estimating the state of the charge rate and/or the deterioration degree of the secondary battery having various electrical characteristics of different manufacturers and models.

The state estimation method of the secondary battery according to the second embodiment includes the step S300 of measuring state variables including the terminal current Ite and the terminal voltage Vte of the operating secondary battery 102 to which the load 106 or the charger 104 is connected, at predetermined time intervals dt. This learning method includes: the step S302 of preprocessing the state variables and calculating the state estimation input data; and the step S304 of estimating the present charge rate and/or the deterioration degree of the operating secondary battery 102, from the state estimation input data, using the trained state estimation model 432 by the learning method according to the first embodiment. Then, the step S302 of calculating the state estimation input data uses the time-series data of the terminal currents Ite and the time-series data of the terminal voltages Vte to calculate the current difference δIte, and the voltage difference δVte. The current difference δIte is the difference of the terminal currents Ite, and the voltage difference δVte is the difference of the terminal voltages Vte (process 500 in FIG. 13). The step S302 uses the time-series data of the current differences δIte and the time-series data of the voltage differences δVte, to calculate the difference gradient Sdiff (process 502 in FIG. 13). The difference gradient Sdiff is the change rate of the voltage differences δVte with respect to the current differences δIte, in the period to the present from the past that goes back a first predetermined time T1 from the present. Then, the step S302 generates the state estimation input data 'x2($t_n$) (the process 518 in FIG. 13) including: time-series data 'Sdiff($t_n$) of the difference gradients Sdiff; time-series data 'Voc($t_n$) of the open circuit voltages Voc of the operating secondary battery; time-series data 'Dvoc($t_n$) of the open circuit voltage change amounts Dvoc each obtained by subtracting the open circuit voltage in the past that goes back the second predetermined time from the present, from the present open circuit voltage; time-series data 'Dsd($t_n$) of the difference gradient change amounts Dsd each obtained by subtracting the difference gradient in the past that goes back the second predetermined time from the present, from the present difference gradient; and time-series data 'ΣIte($t_n$) of the integrated current values ΣIte, each of which is a sum of the values of the terminal currents continuously acquired in the period to the present from the past that goes back the second predetermined time from the present.

The state estimation method of the secondary battery according to the second embodiment is executed by, for example, the state estimation device 400. The state estimation device 400 includes a state observation unit 422 that measures state variables including the terminal current Ite and the terminal voltage Vte of the operating secondary battery 404 at each predetermined time interval dt. In addition, the state estimation device 400 includes a preprocessing unit 424 that preprocesses the state variables measured by the state observation unit 422 and calculates the state estimation input data. Furthermore, the state estimation device 400 includes a state estimation unit 426 that uses the state estimation model 432 trained by the learning method according to the first embodiment, to estimate the present charge rate and/or the deterioration degree of the operating secondary battery 102, from the state estimation input data.

Then, the preprocessing unit 424 uses the time-series data of the terminal currents Ite and the time-series data of the terminal voltages Vte acquired by the state observation unit 422, to calculates the current difference δIte, and the voltage difference δVte. The current difference δIte is the difference in terminal currents, and the voltage difference δVte is the difference in terminal voltages. In addition, the preprocessing unit 424 uses the time-series data of the current differences δIte and the time-series data of the voltage differences δVte, to calculate the difference gradient Sdiff. The difference gradient Sdiff is the change rate of the voltage differences δVte with respect to the current differences δIte, in the period to the present from the past that goes back a first predetermined time T1 from the present. Then, the preprocessing unit 424 generates the state estimation input data 'x2($t_n$) including: time-series data 'Sdiff($t_n$) of the difference gradients Sdiff; time-series data 'Voc($t_n$) of the open circuit voltages Voc of the operating secondary battery; time-series data 'Dvoc($t_n$) of the open circuit voltage change amounts Dvoc each obtained by subtracting the open circuit voltage in the past that goes back the second predetermined time from the present, from the present open circuit voltage; time-series data 'Dsd($t_n$) of the difference gradient change amounts Dsd each obtained by subtracting the difference gradient in the past that goes back the second predetermined time from the present, from the present difference gradient; and time-series data 'ΣIte($t_n$) of the integrated current values ΣIte, each of which is a sum of the values of the terminal currents continuously acquired in the period to the present from the past that goes back the second predetermined time from the present.

These configurations can accurately estimate the state of charge rate and/or deterioration degree of secondary batteries having various electrical characteristics of different manufacturers and models in operation of these secondary batteries.

REFERENCE SIGNS LIST

100 . . . machine learning device, 102, 404 . . . secondary battery, 104 . . . charger, 106 . . . load, 108 . . . changeover switch, 110, 406 . . . characteristic measuring instrument, 112 . . . learning management device, 120, 420, 440 . . . processing device, 122, 428, 448 . . . storage device, 124, 430 . . . open circuit voltage estimation model, 126, 432 . . . state estimation model, 130 . . . state variable measuring unit, 132 . . . input data generation unit, 134 . . . model learning unit, 200 . . . approximate straight line, 300, 310 . . . input layer, 302, 312 . . . intermediate layer, 304, 314 . . . output layer, 400 . . . state estimation device, 402 . . . vehicle, 408 . . . energization controller, 410 . . . rotary electric machine, 412 . . . external charging device, 414 . . . driving control device, 422 . . . state observation unit, 424 . . . preprocessing unit, 426 . . . state estimation unit, 442 . . . motor control unit, 444 . . . charge control unit, 446 . . . notification control unit, 450 . . . display device, 452 . . . accelerator pedal sensor, 454 . . . brake pedal sensor, 456 . . . vehicle speed sensor, 500, 502, 504, 506, 508, 510, 512, 514, 516, 518 . . . process, 600, 602, 604, 606 . . . line

What is claimed is:

1. A learning method of a state estimation model of a secondary battery by a first processor, the secondary battery being included in a vehicle powered by the secondary battery, the learning method using machine learning, the state estimation model estimating a charge rate and/or a deterioration degree of the operating secondary battery, the secondary battery being connected to a load or a charger, the state estimation model being stored in a memory, the learning method comprising:

a step of measuring state variables at predetermined time intervals, the state variables including terminal currents and terminal voltages of the operating secondary battery;

a step of calculating state estimation input data preprocessing the state variables;

a step of training the state estimation model to learn a relationship of the state estimation input data with the charge rate and/or the deterioration degree of the operating secondary battery, by machine learning, wherein the step of calculating:

uses time-series data of the terminal currents and time-series data of the terminal voltages to calculate current differences and voltage differences, each current difference being a difference in the terminal currents, each voltage difference being a difference in the terminal voltages;

uses time-series data of the current differences and time-series data of the voltage differences to calculate difference gradients, each difference gradient being a change rate of the voltage differences with respect to the current differences in a period to a present from a past that goes back a first predetermined time from the present; and generates the state estimation input data including:

time-series data of the difference gradients;

time-series data of open circuit voltages of the operating secondary battery;

time-series data of open circuit voltage change amounts, each open circuit voltage change amount being obtained by subtracting the open circuit voltage in a past that goes back a second predetermined time from a present, from the present open circuit voltage;

time-series data of difference gradient change amounts, each difference gradient change amount being obtained by subtracting the difference gradient in the past that goes back the second predetermined time from the present, from the present difference gradient; and time-series data of integrated current values, each integrated current values being a sum of the terminal current values continuously acquired in a period to the present from the past that goes back the second predetermined time from the present; and a step of displaying a message suggesting at least one of charging and replacing the secondary battery in the vehicle based on the generated state estimation input data.

2. The learning method of the state estimation model of the secondary battery according to claim 1, wherein
the state estimation input data further includes time-series data of the terminal currents.

3. The learning method of the state estimation model of the secondary battery according to claim 1, wherein
the step of calculating:
uses time-series data of the terminal currents and time-series data of the terminal voltages, and time-series data of the difference gradients, as voltage estimation input data, to estimate an open circuit voltage of the operating secondary battery; and
uses the estimated open circuit voltage to calculate the state estimation input data.

4. The learning method of the state estimation model of the secondary battery according to claim 1, wherein
each difference gradient is calculated using the least squares method.

5. The learning method of the state estimation model of the secondary battery according to claim 1, wherein
each current difference and each voltage difference are respectively a fourth-order difference of time-series data of the terminal currents and a fourth-order difference of time-series data of the terminal voltages.

6. The learning method of the state estimation model of the secondary battery according to claim 1, wherein
the state estimation model is configured of an RNN (Recurrent Neural Network).

7. The learning method of the state estimation model of the secondary battery according to claim 6, wherein
an intermediate layer of the RNN configuring the state estimation model is configured of an LSTM (Long Short Term Memory) or a GRU (Gated Recurrent Unit).

8. The learning method of the state estimation model of the secondary battery according to claim 1, wherein
the state estimation model is configured of a one-dimensional CNN (Convolutional Neural Network).

9. The learning method of the state estimation model of the secondary battery according to claim 1, wherein
the state estimation model is generated by learning using time-series data of state variables including terminal currents and terminal voltages for each of a plurality of secondary batteries with different electrical characteristics, the secondary batteries each being connected to a load or a charger.

10. A state estimation method of a secondary battery by a second processor, comprising:
a step of measuring state variables including terminal currents and terminal voltages of an operating secondary battery to which a load or a charger is connected, at predetermined time intervals;
a step of calculating state estimation input data by preprocessing the state variables; and
a step of estimating a present charge rate and/or a deterioration degree of the operating secondary battery, from the state estimation input data, using a state estimation model trained by a learning method of the secondary battery state estimation model according to claim 1,
wherein the step of calculating:
uses time-series data of the terminal currents and time-series data of the terminal voltages to calculate current differences and voltage differences, each current difference being a difference in the terminal currents, each voltage difference being a difference in the terminal voltages;
uses time-series data of the current differences and time-series data of the voltage differences to calculate difference gradients, each difference gradient being a change rate of the voltage differences with respect to the current differences in a period to a present from a past that goes back a first predetermined time from the present; and
generates the state estimation input data including:
time-series data of the difference gradients;
time-series data of open circuit voltages of the operating secondary battery;
time-series data of open circuit voltage change amounts, each open circuit voltage change amount being obtained by subtracting the open circuit voltage in a past that goes back a second predetermined time from the present, from the present open circuit voltage;
time-series data of difference gradient change amounts, each difference gradient change amount being obtained by subtracting the difference gradient in the past that goes back the second predetermined time from the present, from the present difference gradient; and
time-series data of integrated current values, each integrated current values being a sum of the terminal current values continuously acquired in a period to the present from the past that goes back the second predetermined time from the present.

11. A state estimation device of a secondary battery, the device comprising a second processor,
wherein the second processor is configured to:
measure state variables at predetermined time intervals, the state variables including terminal currents and terminal voltages of the operating secondary battery;
perform preprocessing of the measured state variables, to calculate state estimation input data; and
estimate a present charge rate and/or a deterioration degree of the operating secondary battery, from the state estimation input data, using a state estimation model trained by a learning method of the state estimation model of the secondary battery according to claim 1,
wherein in the preprocessing, the second processor:
uses time-series data of the measured terminal currents and time-series data of the measured terminal voltages, to calculate current differences and voltage differences, each current difference being a difference in the terminal currents, each voltage difference being a difference in the terminal voltages;
uses time-series data of the current differences and time-series data of the voltage differences to calculate difference gradients, each difference gradient being a change rate of the voltage differences with respect to the current differences in a period to a present from a past that goes back a first predetermined time from the present; and
generates the state estimation input data including:
time-series data of the difference gradients;
time-series data of open circuit voltages of the operating secondary battery;
time-series data of open circuit voltage change amounts, each open circuit voltage change amount being obtained by subtracting the open circuit voltage in a past that goes back a second predetermined time from a present, from the present open circuit voltage;

time-series data of difference gradient change amounts, each difference gradient change amount being obtained by subtracting the difference gradient in the past that goes back the second predetermined time from the present, from the present difference gradient; and time-series data of integrated current values, each integrated current values being a sum of the terminal current values continuously acquired in a period to the present from the past that goes back the second predetermined time from the present.

\* \* \* \* \*